United States Patent
Kyono et al.

(10) Patent No.: US 8,748,868 B2
(45) Date of Patent: Jun. 10, 2014

(54) NITRIDE SEMICONDUCTOR LIGHT EMITTING DEVICE AND EPITAXIAL SUBSTRATE

(75) Inventors: Takashi Kyono, Itami (JP); Yohei Enya, Itami (JP); Katsushi Akita, Itami (JP); Masaki Ueno, Itami (JP); Yusuke Yoshizumi, Itami (JP); Takamichi Sumitomo, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 301 days.

(21) Appl. No.: 13/294,010

(22) Filed: Nov. 10, 2011

(65) Prior Publication Data

US 2012/0112204 A1    May 10, 2012

Related U.S. Application Data

(63) Continuation of application No. PCT/JP2010/055591, filed on Mar. 29, 2010.

(30) Foreign Application Priority Data

May 11, 2009    (JP) ................................ P2009-114881

(51) Int. Cl.
  *H01L 29/06*    (2006.01)
  *H01L 31/00*    (2006.01)
(52) U.S. Cl.
  USPC .................... 257/18; 257/13; 257/14; 257/15
(58) Field of Classification Search
  USPC .......................................... 257/13, 14, 15, 18
  See application file for complete search history.

(56) References Cited

U.S. PATENT DOCUMENTS

| 6,542,528 B1 | 4/2003 | Sato et al. |
| 2001/0030316 A1 | 10/2001 | Kuramoto et al. |
| 2003/0138015 A1 | 7/2003 | Sato et al. |

(Continued)

FOREIGN PATENT DOCUMENTS

| JP | 10-135576 A | 5/1998 |
| JP | 2001-024285 | 1/2001 |

(Continued)

OTHER PUBLICATIONS

Office Action in Taiwanese Patent Application No. 099110790, dated Apr. 29, 2013.

(Continued)

*Primary Examiner* — Jarrett Stark
(74) *Attorney, Agent, or Firm* — Venable LLP; Michael A. Sartori; Tamatane J. Aga

(57) ABSTRACT

For a nitride semiconductor light emitting device, a c-axis vector of hexagonal GaN of a support substrate is inclined to an X-axis direction with respect to a normal axis Nx normal to a primary surface. In a semiconductor region an active layer, a first gallium nitride-based semiconductor layer, an electron block layer, and a second gallium nitride-based semiconductor layer are arranged along the normal axis on the primary surface of the support substrate. A p-type cladding layer is comprised of AlGaN, and the electron block layer is comprised of AlGaN. The electron block layer is subject to tensile strain in the X-axis direction. The first gallium nitride-based semiconductor layer is subject to compressive strain in the X-axis direction. The misfit dislocation density at an interface is smaller than that at an interface. A barrier to electrons at the interface is raised by piezoelectric polarization.

20 Claims, 14 Drawing Sheets

(56) References Cited

U.S. PATENT DOCUMENTS

| | | |
|---|---|---|
| 2004/0056259 A1 | 3/2004 | Goto et al. |
| 2006/0273326 A1 | 12/2006 | Goto et al. |
| 2008/0285609 A1 | 11/2008 | Ohta et al. |

FOREIGN PATENT DOCUMENTS

| | | |
|---|---|---|
| JP | 2001-031298 | 2/2001 |
| JP | 2001-230497 A | 8/2001 |
| JP | 2002-261395 | 9/2002 |
| JP | 2005-327908 | 11/2005 |
| JP | 2008-060375 | 3/2008 |
| JP | 2009-059933 A | 3/2009 |
| JP | 2009-081428 A | 4/2009 |
| JP | 2009-094360 A | 4/2009 |
| TW | 200816523 A | 4/2008 |
| TW | 200849676 A | 12/2008 |

OTHER PUBLICATIONS

Office Action in Korean Patent Application No. 10-2011-7029461 dated Mar. 29, 2013.

Notice of Allowance in Korean Patent Application No. 10-2011-7029461, dated Sep. 4, 2013.

E. Fred Schubert, "Light-Emitting Diodes," Cambridge university press, (2003), pp. 109-112.

NITRIDE SEMICONDUCTOR LIGHT EMITTING DEVICE AND EPITAXIAL SUBSTRATE

CROSS REFERENCE TO RELATED APPLICATIONS

This is a continuation of a application PCT application No. PCT/JP2010/055591 filed on Mar. 29, 2010, claiming the benefit of priorities from Japanese Patent application No. 2009-114881 filed on May 11, 2009.

TECHNICAL FIELD

The present invention relates to a nitride semiconductor light emitting device and an epitaxial substrate.

BACKGROUND ART

Patent Literature 1 describes a semiconductor light emitting device making use of GaN semiconductors. In order to reduce carrier overflow occurring with carrier injection, this semiconductor light emitting device is provided with a stacked multiple quantum barrier of AlGaN/GaN or a strain-compensated multiple quantum barrier of AlGaN/InGaN in either of upper part and lower part of an active layer.

CITATION LIST

Patent Literature

Patent Literature 1: Japanese Patent Application No. 2001-31298

SUMMARY OF INVENTION

Technical Problem

Patent Literature 1 provides reduction in overflow of carriers injected into the active layer of the semiconductor light emitting device by use of the multiple quantum barriers. Patent Literature 1 discloses a preferred example in which the semiconductor light emitting device is formed on a sapphire substrate.

The nitride semiconductor light emitting device includes an n-type semiconductor layer, an active layer, and a p-type semiconductor layer. For example, an AlGaN electron block layer and an AlGaN cladding layer are grown on the active layer. These AlGaN-based semiconductors are likely to undergo lattice relaxation on a semipolar plane. According to Inventors' knowledge, a slip plane (e.g., c-plane slip plane) becomes active in an AlGaN-based semiconductor on a semipolar plane, and misfit dislocations at the interface therebetween are introduced, instead of creation of cracks in the semiconductor, so that the AlGaN-based semiconductor on the semipolar plane relaxes strain therein. Occurrence of this lattice relaxation decreases the strain of the AlGaN-based semiconductor and changes piezoelectric polarization. In the AlGaN-based semiconductor and a semiconductor adjacent to the AlGaN-based semiconductor, therefore, the change of piezoelectric polarization causes electric influence on the barrier height of the electron block structure. According to Inventors' research, in certain cases, the change of piezoelectric polarization resulting from lattice relaxation can degrade the carrier block performance of the electron block layer.

It is an object of the present invention to provide a nitride semiconductor light emitting device capable of reducing the degradation of carrier block performance due to the lattice relaxation, and t is another object to provide an epitaxial substrate for the nitride semiconductor light emitting device.

Solution to Problem

A nitride semiconductor light emitting device according to one aspect of the present invention comprises: (a) a support substrate comprising a hexagonal gallium nitride semiconductor; (b) a semiconductor region comprising an active layer, a first gallium nitride-based semiconductor layer, an electron block layer, and a second gallium nitride-based semiconductor layer, and the semiconductor region being provided on a primary surface of the support substrate; and (c) a p-type cladding layer located on a primary surface of the semiconductor region. The c-axis of the hexagonal gallium nitride semiconductor is inclined to a predetermined direction with respect to a normal axis normal to the primary surface of the support substrate; the p-type cladding layer comprises AlGaN; the electron block layer comprises AlGaN; the first gallium nitride-based semiconductor layer is provided between the active layer and the electron block layer; the second gallium nitride-based semiconductor layer is provided between the p-type cladding layer and the electron block layer; a material of the second gallium nitride-based semiconductor layer is different from a material of the electron block layer; the material of the second gallium nitride-based semiconductor layer is different from a material of the p-type cladding layer; a bandgap of the first gallium nitride-based semiconductor layer is smaller than a bandgap of the electron block layer; the electron block layer is subject to tensile stain in the predetermined direction; the first gallium nitride-based semiconductor layer is subject to compressive strain in the predetermined direction; a misfit dislocation density at an interface between the first gallium nitride-based semiconductor layer and the electron block layer is smaller than a misfit dislocation density at an interface between the second gallium nitride-based semiconductor layer and the p-type cladding layer.

This nitride semiconductor light emitting device has the p-type cladding layer comprising AlGaN and the electron block layer comprising AlGaN. The misfit dislocation density at the interface between the electron block layer and the first gallium nitride (GaN)-based semiconductor layer is smaller than the misfit dislocation density at the interface between the p-type cladding layer and the second gallium nitride based semiconductor layer. Accordingly, the relaxation of strain resulting from introduction of misfit dislocations does not substantially occur in the electron block layer. Therefore, the electron block layer is subject to tensile strain in the above predetermined direction. When the electron block layer is subject to tensile strain in the predetermined direction, piezoelectric polarization in the electron block layer has a component defined in a direction from the active layer to the p-type cladding layer. This piezoelectric polarization raises the height of barrier to electrons at the interface between the electron block layer and the first gallium nitride based semiconductor layer. Furthermore, the bandgap of the first gallium nitride based semiconductor layer is smaller than the bandgap of the electron block layer, and the first gallium nitride based semiconductor layer is subject to compressive strain in the predetermined direction. When the first gallium nitride based semiconductor layer is subject to compressive strain applied thereto in the predetermined direction, piezoelectric polarization in the first gallium nitride based semiconductor layer has a component along a direction from the p-type cladding layer to the active layer. Furthermore, the introduction of the misfit dislocation density at the interface between the second gallium nitride based semiconductor layer and the p-type cladding layer brings about lattice relaxation in part or in all of the p-type cladding layer to reduce the polarization due to strain in the p-type cladding layer. The misfit dislocations reduce influence of the lattice constant difference between the semiconductor layer formed on the active layer, and the p-type cladding layer on the electron block layer. The electron block layer is isolated from the p-type cladding layer by the second gallium nitride based semiconductor layer. Hence, it is feasible to reduce influence of the p-type cladding layer on the strain of the electron block layer and thereby to impart the desired strain to the electron block layer. The electron block layer is thus not affected by the dislocations associated with the lattice relaxation of the p-type cladding layer.

In the nitride semiconductor light emitting device according to the present invention, preferably, a refractive index of the second gallium nitride based semiconductor layer is larger than a refractive index of the electron block layer, and the refractive index of the second gallium nitride based semiconductor layer is larger than a refractive index of the p-type cladding layer.

In this nitride semiconductor light emitting device, the second gallium nitride based semiconductor layer can serve as an optical guide layer, and the first gallium nitride based semiconductor layer can also serve as an optical guide layer.

In the nitride semiconductor light emitting device according to the present invention, preferably, a lattice constant in an unstrained state of the second gallium nitride based semiconductor layer is larger than a lattice constant in an unstrained state of the electron block layer and the lattice constant in the unstained state of the second gallium nitride based semiconductor layer is larger than a lattice constant in an unstrained state of the p-type cladding layer.

In this nitride semiconductor light emitting device, the second gallium nitride based semiconductor layer can isolate the electron block layer and the p-type block layer from each other. In this configuration, the electron block layer and the p-type cladding layer are located near enough to become integrated to enable the reduction of the relaxation in the electron block layer, thereby reducing degradation of carrier injection efficiency in conjunction with the relaxation.

In the nitride semiconductor light emitting device according to the present invention, preferably, the second gallium nitride based semiconductor layer comprises GaN or InGaN.

In this nitride semiconductor light emitting device, when the second gallium nitride based semiconductor layer is comprised of GaN or InGaN not containing Al, it is feasible to prevent the electron block layer from being lattice-relaxed by influence of the p-type cladding layer. Furthermore, GaN or InGaN functions as a guide layer.

In the nitride semiconductor light emitting device according to the present invention, preferably, a thickness of the second gallium nitride based semiconductor layer is not less than 30 nm and not more than 1 μm.

In this nitride semiconductor light emitting device, when the thickness is not less than 30 nm, it is feasible to reduce the lattice relaxation of the electron block layer due to the influence of the p-type cladding layer. When the thickness is over 1 μm, the p-type cladding layer is located apart from the active layer, so as to fail to achieve excellent optical confinement.

In the nitride semiconductor light emitting device according to the present invention, preferably, a thickness of the electron block layer is not less than 5 nm and not more than 50 nm.

In this nitride semiconductor light emitting device, when the thickness is not less than 5 nm, it is feasible to prevent degradation of block effect caused if the thickness of the electron block layer is too small. When the thickness is not more than 50 nm, the electron block layer can be strained while avoiding relaxation of the electron block layer.

In the nitride semiconductor light emitting device according to the present invention, preferably, a thickness of the p-type cladding layer is not less than 300 nm and not more than 1.5 μm.

When the thickness is not less than 300 nm, this nitride semiconductor light emitting device provides desired optical confinement performance. When the thickness is not more than 1.5 μm, the upper limit is practical in view of throughput as well. Since the misfit dislocation density at the interface between the first gallium nitride based semiconductor layer and the electron block layer is smaller than that at the interface between the second gallium nitride based semiconductor layer and the p-type cladding layer, as described above, the p-type cladding layer is lattice-relaxed in part or in all on a semipolar plane.

In the nitride semiconductor light emitting device according to the present invention, preferably, an Al composition of the electron block layer is not less than 0.05 and not more than 0.3.

When the Al composition of the electron block layer is less than 0.05, this nitride semiconductor light emitting device demonstrates degradation of the blocking effect. When the Al composition of the electron block layer is not more than 0.3, it is feasible to avoid the lattice relaxation and thereby to avoid generation of dislocations at the lower interface of the electron block layer.

In the nitride semiconductor light emitting device according to the present invention, an Al composition of the p-type cladding layer can be not less than 0.03 and not more than 0.2.

When the Al composition of the cladding layer is not less than 0.03, this nitride semiconductor light emitting device provides desired optical confinement. The Al composition of the cladding layer is preferably not more than 0.2 when consideration is given to crystallinity, electric conductivity, and throughput of the cladding layer. Even if lattice relaxation occurs in the cladding layer, adverse effect thereof is little on band bending in the electron block layer in terms of carrier injection.

In the nitride semiconductor light emitting device according to the present invention, preferably, the misfit dislocation density at the interface between the first gallium nitride based semiconductor layer and the electron block layer is less than $1 \times 10^4 \, \text{cm}^{-1}$.

In this nitride semiconductor light emitting device, when the misfit dislocation density is in the above range, carrier overflow can be reduced by band bending resulting from the strain of the electron block layer.

In the nitride semiconductor light emitting device according to the present invention, preferably, the misfit dislocation density at the interface between the second gallium nitride based semiconductor layer and the p-type cladding layer is not less than $1 \times 10^4 \, \text{cm}^{-1}$.

In this nitride semiconductor light emitting device, improvement in optical confinement can be achieved in the cladding layer when the Al composition of the cladding layer is increased to induce lattice relaxation in part or in all of the cladding layer.

In the nitride semiconductor light emitting device according to the present invention, the p-type cladding layer is lattice-relaxed at least in the predetermined direction on the semiconductor region.

This nitride semiconductor light emitting device is able to achieve improvement in optical confinement in the cladding layer.

In the nitride semiconductor light emitting device according to the present invention, preferably, an angle between the c-axis of the hexagonal III-nitride semiconductor and the normal axis to the support substrate is in the range of not less than 50 degrees and not more than 80 degrees or in the range of not less than 100 degrees and not more than 130 degrees.

In this nitride semiconductor light emitting device, the piezoelectric polarization is opposite to that in a light emitting device on a support substrate with a c-plane primary surface.

In the nitride semiconductor light emitting device according to the present invention, preferably, the angle between the c-axis of the hexagonal III-nitride semiconductor and the normal axis to the support substrate is in the range of not less than 63 degrees and not more than 80 degrees or in the range of not less than 100 degrees and not more than 117 degrees. In this nitride semiconductor light emitting device, the piezoelectric polarization can be made greater.

In the nitride semiconductor light emitting device according to the present invention, preferably, the thickness of the p-type cladding layer is over a critical thickness in the Al composition of AlGaN of the p-type cladding layer.

In this nitride semiconductor light emitting device, since the p-type cladding layer is formed on the semipolar plane, the p-type cladding layer in the thickness of not less than the critical thickness is lattice-relaxed by action of a slip plane. For this reason, it is feasible to achieve improvement in optical confinement in the cladding layer.

The nitride semiconductor light emitting device according to the present invention can further comprise an n-type cladding layer provided between the support substrate and the semiconductor region. The n-type cladding layer comprises AlGaN, and the n-type cladding layer is subject to tensile strain on the primary surface of the support substrate.

In this nitride semiconductor light emitting device, the n-type cladding layer is not lattice-relaxed but is strained according to the difference between the lattice constant of the n-type cladding layer and the lattice constant of the support substrate. The semiconductor region including the electron block layer is formed on the strained n-type cladding layer. For this reason, the electron block layer is subject to tensile strain and the band bending thereof occurs in a direction in which the carrier overflow can be reduced.

The nitride semiconductor light emitting device according to the present invention preferably further comprises an n-type cladding layer provided between the support substrate and the semiconductor region. Preferably, the n-type cladding layer comprises an AlGaN layer, and a thickness of the n-type cladding layer is over a critical thickness in an Al composition of AlGaN of the n-type cladding layer.

In this nitride semiconductor light emitting device, lattice relaxation occurs in the n-type cladding layer. The semiconductor region including the first gallium nitride based semiconductor layer is formed on the lattice-relaxed n-type cladding layer. For this reason, the first gallium nitride based semiconductor layer is subject to compressive strain and the band bending thereof occurs in a direction in which the carrier overflow can be reduced.

The nitride semiconductor light emitting device according to the present invention can further comprise an n-type cladding layer provided between the support substrate and the semiconductor region. The n-type cladding layer comprises an InAlGaN layer, and the first gallium nitride based semiconductor layer comprises InGaN.

In this nitride semiconductor light emitting device, since the n-type cladding layer comprises the InAlGaN layer, it is feasible to provide the InAlGaN layer with the bandgap and thickness more suitable for the cladding and to make the lattice constant of this InAlGaN layer closer to the lattice constant of GaN than the cladding layer comprised of AlGaN. The use of the InAlGaN layer makes the lattice relaxation less likely to occur even in the case where the first gallium nitride based semiconductor layer is comprised of InGaN; then it becomes feasible to subject the first gallium nitride based semiconductor layer to compressive strain.

Another aspect of the present invention is an epitaxial substrate for a nitride semiconductor light emitting device. The epitaxial substrate comprises: (a) a substrate comprising a hexagonal gallium nitride semiconductor; (b) a semiconductor region comprising an active layer, a first gallium nitride-based semiconductor layer, an electron block layer, and a second gallium nitride-based semiconductor layer, and provided on a primary surface of the support substrate; and (c) a p-type cladding layer provided on a primary surface of the semiconductor region. The c-axis of the hexagonal gallium nitride semiconductor is inclined toward a predetermined direction with respect to a normal axis normal to the primary surface of the substrate; the p-type cladding layer comprises AlGaN; the electron block layer comprises AlGaN; the first gallium nitride-based semiconductor layer is provided between the active layer and the electron block layer; the second gallium nitride-based semiconductor layer is provided between the p-type cladding layer and the electron block layer; the electron block layer is subject to tensile stain in the predetermined direction; the first gallium nitride-based semiconductor layer is subject to compressive strain in the predetermined direction; a misfit dislocation density at an interface between the first gallium nitride-based semiconductor layer and the electron block layer is smaller than a misfit dislocation density at an interface between the second gallium nitride-based semiconductor layer and the p-type AlGaN cladding layer.

This epitaxial substrate includes the p-type cladding layer comprising AlGaN and the electron block layer comprising AlGaN. The misfit dislocation density at the interface between the electron block layer and the first gallium nitride based semiconductor layer is smaller than the misfit dislocation density at the interface between the p-type cladding layer and the second gallium nitride based semiconductor layer. For this reason, the relaxation of strain due to introduction of misfit dislocations does not substantially occur in the electron block layer. Therefore, the electron block layer is subject to tensile strain in the predetermined direction. Furthermore, the bandgap of the first gallium nitride based semiconductor layer is smaller than the bandgap of the electron block layer and the first gallium nitride based semiconductor layer is thus subject to compressive strain in the predetermined direction. When the electron block layer is subject to tensile strain in the predetermined direction, piezoelectric polarization in the electron block layer has a component defined in a direction from the active layer to the p-type cladding layer. When the first gallium nitride based semiconductor layer is subject to compressive strain in the predetermined direction, piezoelectric polarization in the first gallium nitride based semiconductor layer has a component defined in a direction from the p-type cladding layer to the active layer. These piezoelectric polarizations raise the height of barrier to electrons at the interface between the electron block layer and the first gallium nitride based semiconductor layer. Furthermore, the introduction of the misfit dislocation density at the interface between the second gallium nitride based semiconductor layer and the p-type cladding layer brings about lattice relaxation in the p-type cladding layer. Accordingly, strain is reduced in the semiconductor layer formed on the active layer. The electron block layer is isolated from the p-type cladding layer by the second gallium nitride based semiconductor layer. Therefore, it is feasible to reduce influence of the p-type cladding layer on the strain of the electron block layer and thereby to impart the desired strain to the electron block layer. The electron block layer is thus not affected by the dislocations associated with the lattice relaxation of the p-type cladding layer.

In the epitaxial substrate according to the present invention, preferably, an angle between the c-axis of the hexagonal III-nitride semiconductor and the normal axis to the support substrate is in the range of not less than 50 degrees and not more than 80 degrees or in the range of not less than 100 degrees and not more than 130 degrees.

The epitaxial substrate according to the present invention can further comprise an n-type cladding layer provided between the substrate and the semiconductor region. The n-type cladding layer comprises an AlGaN layer, and the n-type cladding layer is subject to tensile strain on the primary surface of the substrate.

In this epitaxial substrate, the n-type cladding layer is not lattice-relaxed but is strained according to the difference between the lattice constant of the n-type cladding layer and the lattice constant of the support substrate. The semiconductor region including the electron block layer is formed on the strained n-type cladding layer. For this reason, the electron block layer is subject to tensile strain and the band bending thereof occurs in a direction in which the carrier overflow can be reduced.

The epitaxial substrate according to the present invention preferably further comprises an n-type cladding layer provided between the support substrate and the semiconductor region. Preferably, the n-type cladding layer comprises an AlGaN layer, and a thickness of the n-type cladding layer is over a critical thickness in an Al composition of AlGaN of the n-type cladding layer.

In this epitaxial substrate, lattice relaxation occurs in the n-type cladding layer. The semiconductor region including the first gallium nitride based semiconductor layer is formed on the lattice-relaxed n-type cladding layer. For this reason, the first gallium nitride based semiconductor layer is subject to compressive strain and the band bending thereof occurs in a direction in which the carrier overflow can be reduced.

The above object and other objects, features, and advantages of the present invention will more readily become apparent in view of the following detailed description of the preferred embodiments of the present invention proceeding with reference to the accompanying drawings.

Advantageous Effects of Invention

As described above, one aspect of the present invention provides the nitride semiconductor light emitting device capable of reducing the degradation of the carrier block performance due to lattice relaxation, and another aspect of the present invention provides the epitaxial substrate for the nitride semiconductor light emitting device.

DESCRIPTION OF EMBODIMENTS

The expertise of the present invention can be readily understood in view of the following detailed description with reference to the accompanying drawings presented by way of illustration. The embodiments of the nitride semiconductor light emitting device according to the present invention will be described below with reference to the accompanying drawings. The same portions will be denoted by the same reference signs as much as possible.

Figure 1:
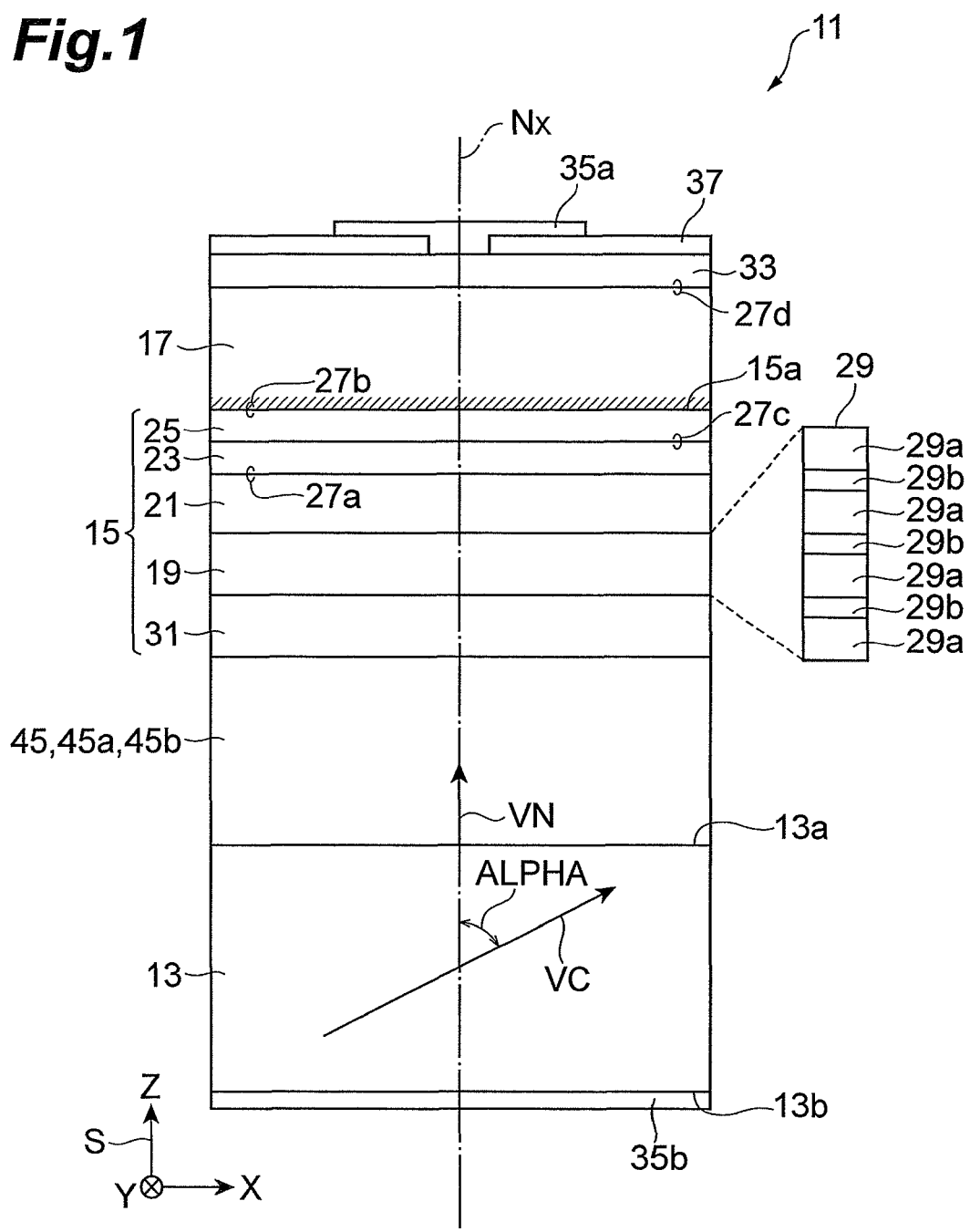
FIG. 1 is a drawing schematically showing a nitride semiconductor light emitting device according to an embodiment of the present invention.
Figure 2:
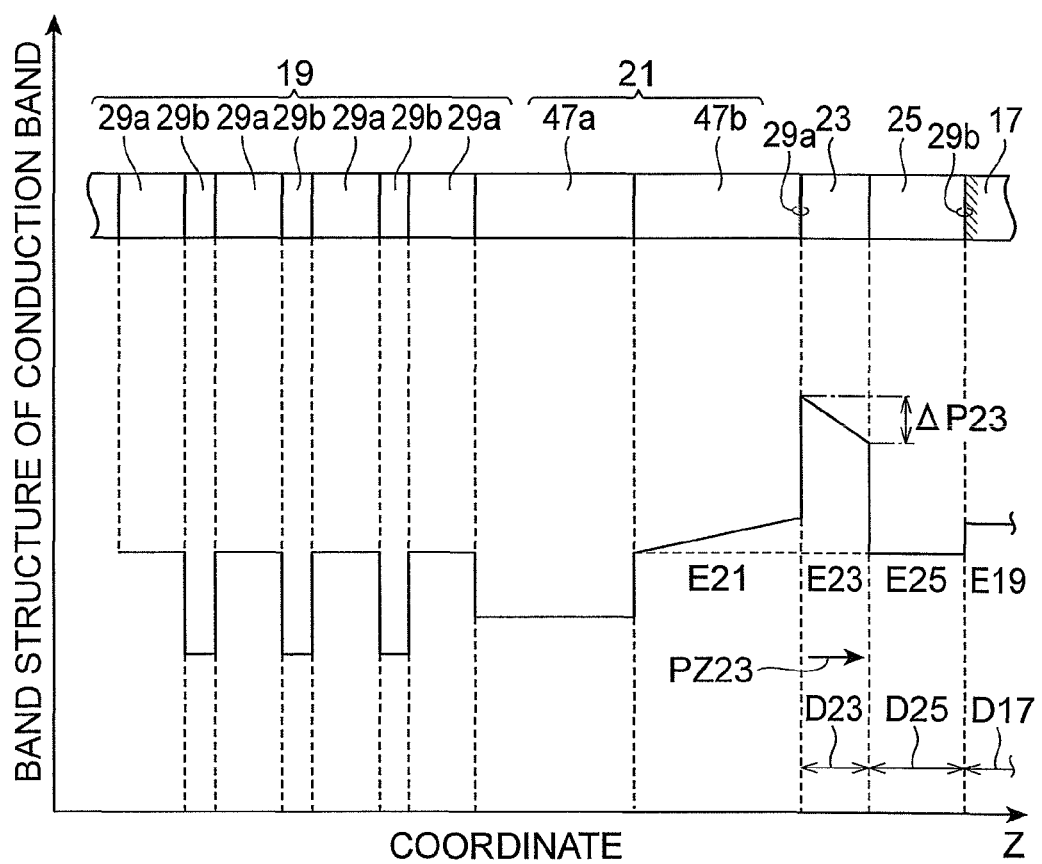
FIG. 2 is a drawing showing a band diagram of conduction bands of an active layer to a p-type cladding layer in the nitride semiconductor light emitting device shown in FIG. 1.

FIG. 1 is a drawing schematically showing a nitride semiconductor light emitting device according to an embodiment of the present invention. FIG. 2 is a drawing showing a conduction band diagram of an active layer to a p-type cladding layer in the nitride semiconductor light emitting device shown in FIG. 1. The nitride semiconductor light emitting device 11 has a support substrate 13, a semiconductor region 15, and a p-type cladding layer 17. The support substrate 13 includes a primary surface 13a and a back surface 13b. With reference to FIG. 1, an orthogonal coordinate system S, a c-axis vector VC, and a normal vector VN are shown. The support substrate 13 comprises a hexagonal gallium nitride (GaN) semiconductor. The c-axis of the hexagonal gallium nitride semiconductor (indicated by the vector VC) is inclined to a predetermined direction (e.g., the X-axis direction) with respect to the axis Nx normal to the primary surface 13a of the support substrate 13. The predetermined direction can be the a-axis, m-axis, or the like of the hexagonal gallium nitride semiconductor. The primary surface 13a can demonstrate semipolar nature and is parallel to a plane defined by the X-axis and Y-axis. The p-type cladding layer 17 is provided on a primary surface 15a of the semiconductor region 15. The semiconductor region 15 and the p-type cladding layer 17 are arranged along the normal axis Nx (e.g., the Z-axis direction) on the primary surface 13a of the support substrate 13. The semiconductor region 15 is provided on the primary surface 13a of the support substrate 13, and includes an active layer 19, a first gallium nitride based semiconductor layer 21, an electron block layer 23, and a second gallium nitride based semiconductor layer 25. The active layer 19, first gallium nitride based semiconductor layer 21, electron block layer 23, and second gallium nitride based semiconductor layer 25 are arranged along the normal axis Nx on the primary surface 13a of the support substrate 13. The first gallium nitride based semiconductor layer 21 is provided between the active layer 19 and the electron block layer 23. The second gallium nitride based semiconductor layer 25 is provided between the p-type cladding layer 17 and the electron block layer 23.

The p-type cladding layer 17 comprises AlGaN and the electron block layer 23 comprises AlGaN. A material of the second gallium nitride based semiconductor layer 25 is different from the material of the electron block layer 23. The material of the second gallium nitride based semiconductor layer 25 is different from the material of the p-type cladding layer 17. The bandgap E21 of the first gallium nitride based semiconductor layer 21 is smaller than the bandgap E23 of the electron block layer 23. The bandgap E25 of the second gallium nitride based semiconductor layer 25 is smaller than the bandgap E23 of the electron block layer 23. The electron block layer 23 is subject to tensile strain applied thereto in the predetermined direction. The misfit dislocation density at an interface 27a between the first gallium nitride based semiconductor layer 21 and the electron block layer 23 is smaller than that at an interface 27b between the second gallium nitride based semiconductor layer 25 and the p-type cladding layer 17. A material of the first gallium nitride based semiconductor layer 21 is different from the material of the electron block layer 23. The first gallium nitride based semiconductor layer 21 is subject to compressive strain applied thereto in the predetermined direction. The material of the first gallium nitride based semiconductor layer 21 is different from the material of the p-type cladding layer 17. The interfaces 27a, 29b are parallel, for example, to a plane defined by the X-axis and Y-axis.

In this nitride semiconductor light emitting device 11, the misfit dislocation density at the interface 27a between the electron block layer (AlGaN) and the first gallium nitride based semiconductor layer 21 is smaller than that at the interface 27b between the p-type cladding layer (AlGaN) and the second gallium nitride based semiconductor layer 25. Hence, there occurs no substantial relaxation of strain by introduction of misfit dislocations in the electron block layer 23. Therefore, the electron block layer 23 is subject to tensile strain in the predetermined direction (X-axis direction). Furthermore, the bandgap E21 of the first gallium nitride based semiconductor layer 21 is smaller than the bandgap E23 of the electron block layer 23, and the first gallium nitride based semiconductor layer 21 is subject to compressive strain in the predetermined direction. When the electron block layer 23 is subject to tensile strain in the predetermined direction, the piezoelectric polarization in the electron block layer 23 has a component PZ23 defined along the direction from the active layer 19 to the p-type cladding layer 17. This piezoelectric polarization raises a barrier AP23 against electrons at the interface 27a. When the first gallium nitride based semiconductor layer 21 is subject to compressive strain in the predetermined direction, the piezoelectric polarization in the first gallium nitride based semiconductor layer 21 has a component defined along the direction from the p-type cladding layer 17 to the active layer 19. Since the band bending around the electron block layer is mainly depicted in FIG. 2, the band bending in the quantum well structure and others is omitted for easier illustration and the same also applies to subsequent band diagrams for the same purpose.

The introduction of the misfit dislocation density at the interface 27b causes lattice relaxation in part or in all of the p-type cladding layer 17 and thus reduces polarization due to strain in the p-type cladding layer 17. This introduction of misfit dislocations reduces influence of the lattice constant difference between the p-type cladding layer 17 and the semiconductor layer which is formed on the active layer 19. The electron block layer 23 is isolated from the p-type cladding layer 17 by the second gallium nitride based semiconductor layer 25. For this reason, it is feasible to reduce influence of the p-type cladding layer 17 on the strain of the electron block layer 23 and thereby to impart the desired strain to the electron block layer 23. The electron block layer 23 is not affected by dislocations associated with the lattice relaxation of the p-type cladding layer 17.

As shown in FIGS. 1 and 2, the active layer 19 has a quantum well structure 29. The quantum well structure 29 includes alternately arranged barrier layers 29a and well layers 29b. The barrier layers 29a comprise, for example, InGaN, GaN, or the like, and the well layers 29b comprise, for example, InGaN or the like. The well layers 29b incorporate strain according to the difference between the lattice constant of the well layers 29b and the lattice constant of the support substrate 13, and the barrier layers 29a involve strain if there is the strain from the difference between the lattice constant of the barrier layers 29a and the lattice constant of the support substrate 13.

In an embodiment, the first gallium nitride based semiconductor layer 21 can serve as an optical guide layer. The second gallium nitride based semiconductor layer 25 can serve as an optical guide layer. The refractive indices of the gallium nitride based semiconductor layers 21, 25 are larger than the index of the electron block layer 23 and larger than the index of the p-type cladding layer 17.

The semiconductor region 15 can include a third gallium nitride based semiconductor layer 31 provided between the support substrate 13 and the active layer 19. In an embodiment, the third gallium nitride based semiconductor layer 31 can serve as an optical guide layer. The nitride semiconductor light emitting device 11 can include a p-type contact layer 33 provided on the p-type cladding layer 17. The p-type contact layer 33 can be made of GaN, AlGaN, or the like. A p-side electrode 35a is in contact with the p-type contact layer 33 through an aperture of insulating film 37.

As shown in FIG. 1, the nitride semiconductor light emitting device 11 can include an n-side electrode 35b in contact with the back surface 13b of the support substrate 13. An angle ALPHA between the c-axis (VC) of the hexagonal GaN semiconductor of the support substrate 13 and the normal axis Nx is preferably in the range of not less than 50 degrees and not more than 80 degrees or in the range of not less than 100 degrees and not more than 130 degrees. In this angular range, the piezoelectric polarization is made opposite to that in a light emitting device on a support substrate with a c-plane primary surface. The angle ALPHA between the c-axis (VC) of the hexagonal GaN semiconductor and the normal axis Nx is preferably in the range of not less than 63 degrees and not more than 80 degrees or in the range of not less than 100 degrees and not more than 117 degrees. In this angular range, the magnitude of the piezoelectric polarization can be made greater. For this reason, the band bending around the electron block layer becomes a band structure resistant to carrier overflow.

The lattice constant in an unstrained state of the second gallium nitride based semiconductor layer 25 is larger than the lattice constant of AlGaN in an unstrained state of the p-type cladding layer 17. The lattice constant of AlGaN in the unstrained state of the p-type cladding layer 17 is larger than the lattice constant of AlGaN in an unstrained state of the electron block layer 23. The second gallium nitride based semiconductor layer 25 can isolate the electron block layer 23 and the p-type cladding layer 17 from each other. This isolation allows the electron block layer 23 and the p-type cladding layer 17 to be located near enough to become integrated to reduce the relaxation of the electron block layer 23, and can reduce degradation of carrier injection efficiency in conjunction with the relaxation.

Figure 3:
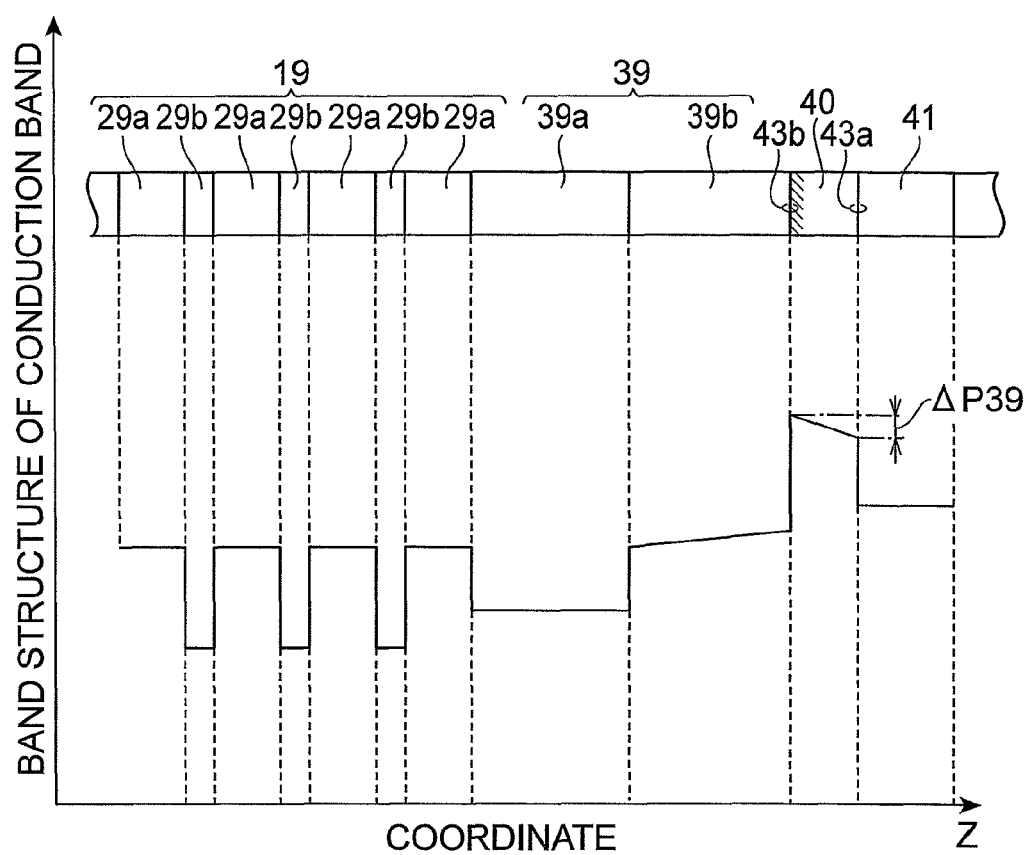
FIG. 3 is a drawing showing a conduction band structure of a nitride semiconductor light emitting device in which an electron block layer and a p-type cladding layer are in contact with each other.

FIG. 3 is a drawing showing a conduction band structure of a nitride semiconductor light emitting device in which the electron block layer and p-type cladding layer are in contact with each other. With reference to FIG. 3, an optical guide layer 39 (InGaN layer 39a and GaN layer 39b), an electron block layer 40, and a p-type cladding layer 41 are formed in order on the active layer 19. The electron block layer 40 is comprised of AlGaN and the p-type cladding layer 41 is also comprised of AlGaN. The electron block layer 40 and p-type cladding layer 41 make a junction 43a, and the electron block layer 40 and optical guide layer 39 make a junction 43b. The misfit dislocation density at the junction 43b is larger than that at the junction 43a. The electron block layer 40 and the p-type cladding layer 41 together incorporate strain and misfit dislocation density is not introduced to the junction 43a. On the other hand, the misfit dislocation density is introduced to the junction 43b because of the difference between the lattice constant of the electron block layer 40 and the lattice constant of the optical guide layer 39. Strain of the electron block layer 40 is not so large. For this reason, it is infeasible to increase a barrier AP39 against electrons in the electron block layer 40 by making use of this strain.

Reference is made again to FIGS. 1 and 2. Since a slip plane (e.g., c-plane slip plane) is active in the support substrate 13 having the semipolar primary surface, the AlGaN layer is likely to undergo relaxation in the predetermined direction (off direction). The relaxation weakens the piezoelectric polarization and as a consequence of this, carrier overflow becomes more likely to occur. When the electron block layer and the p-type cladding layer are continuously deposited, the integrated strain of these layers is exerted on the lower interface of the electron block layer, so as to introduce dislocations to this interface.

Since the p-type cladding layer 17 is located apart from the electron block layer 23, the electron block layer is securely strained. When a GaN layer and/or an InGaN layer is provided between the electron block layer 17 and the p-type cladding layer 23, the electron block layer 23 in a small thickness becomes less likely to be relaxed. On the other hand, the p-type cladding layer 17 is relaxed to generate misfit dislocations at the lower interface of the p-type cladding layer, and these dislocations cause little influence on the band bending around the electron block layer 23.

Figure 4:
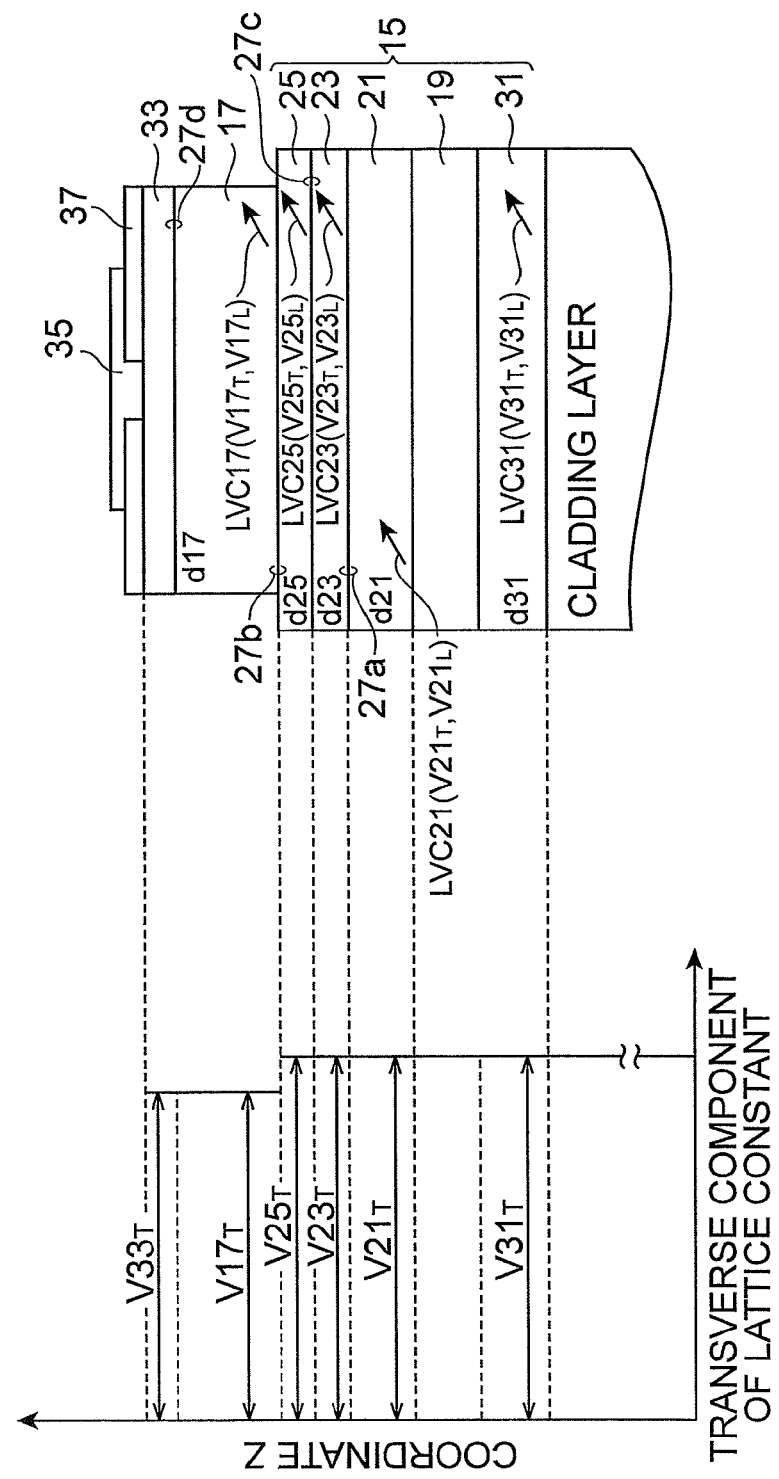
FIG. 4 is a drawing showing lattice constants in semiconductor layers of the nitride semiconductor light emitting device shown in FIG. 1.

The relation of lattice constants will be described in more detail with reference to FIG. 4. FIG. 4 is a drawing showing the lattice constants in the semiconductor layers of the nitride semiconductor light emitting device shown in FIG. 1. A c-axis direction of AlGaN of the p-type cladding layer 17 and a magnitude of lattice constant d17 in the c-axis direction are represented by a lattice vector LVC17. The lattice vector LVC17 has a longitudinal component $V17_L$ in the direction of the normal axis Nx and a transverse component $V17_T$ perpendicular to the longitudinal component. A c-axis direction in AlGaN of the electron block layer 23 and a magnitude of lattice constant d23 in the c-axis direction are represented by a lattice vector LVC23. The lattice vector LVC23 has a longitudinal component $V23_L$ in the direction of the normal axis Nx and a transverse component $V23_T$ perpendicular to the longitudinal component. The transverse component $V17_T$ is smaller than the transverse component $V23_T$. In the semiconductor layers of the nitride semiconductor light emitting device on the right side of FIG. 4 (the same will also apply to FIGS. 5 and 6), in order to show this relation of the transverse components in the figures, the lateral width of the p-type cladding layer 17 is depicted so as to be smaller than the lateral width of the electron block layer 23.

A c-axis direction in the gallium nitride based semiconductor of the gallium nitride based semiconductor layer 25 and a magnitude of lattice constant d25 in the c-axis direction are represented by a lattice vector LVC25. The lattice vector LVC25 has a longitudinal component $V25_L$ in the direction of the normal axis Nx and a transverse component $V25_T$ perpendicular to the longitudinal component. The transverse component $V17_T$ is smaller than the transverse component $V25_T$. In the semiconductor layers of the nitride semiconductor light emitting device on the right side of FIG. 4, the lateral width of the p-type cladding layer 17 is depicted therein so as to be smaller than the lateral width of the gallium nitride based semiconductor layer 25 to show this relation of the transverse components (the same will also apply to FIGS. 5 and 6).

A c-axis direction in the gallium nitride based semiconductor of the gallium nitride based semiconductor layer 21 and a magnitude of lattice constant d21 in the c-axis direction are represented by a lattice vector LVC21. The lattice vector LVC21 has a longitudinal component $V21_L$ in the direction of the normal axis Nx and a transverse component $V21_T$ perpendicular to the longitudinal component. The transverse component $V17_T$ is smaller than the transverse component $V21_T$. In the semiconductor layers of the nitride semiconductor light emitting device on the right side of FIG. 4, the lateral width of the p-type cladding layer 17 is depicted so as to be smaller than the lateral width of the gallium nitride based semiconductor layer 21 to show this relation of the transverse components (the same will also apply to FIGS. 5 and 6).

A c-axis direction in the gallium nitride based semiconductor of the gallium nitride based semiconductor layer 31 and a magnitude of lattice constant d31 in the c-axis direction are represented by a lattice vector LVC31. The lattice vector LVC31 has a longitudinal component $V31_L$ in the direction of the normal axis Nx and a transverse component $V31_T$ perpendicular to the longitudinal component. The transverse component $V17_T$ is smaller than the transverse component $V31_T$. In the semiconductor layers of the nitride semiconductor light emitting device on the right side of FIG. 4, the lateral width of the p-type cladding layer 17 is depicted so as to be smaller than the lateral width of the gallium nitride based semiconductor layer 31 to show this relation of the transverse components (the same will also apply to FIGS. 5 and 6).

With reference to FIG. 4, the gallium nitride based semiconductor layer 31, active layer 19, gallium nitride based semiconductor layer 21, electron block layer 23, and gallium nitride based semiconductor layer 25 are coherently grown on the n-type cladding layer, and the transverse components of the lattice constants of the gallium nitride based semiconductor layer 31, active layer 19, gallium nitride based semiconductor layer 21, electron block layer 23, and gallium nitride based semiconductor layer 25 are effectively equal to each other. Furthermore, the thicknesses of these layers each are smaller than the critical thickness.

With reference to FIGS. 1 and 2, the thickness D23 of the electron block layer 23 is preferably not less than 5 nm. When the thickness D23 is not less than 5 nm, it is feasible to prevent degradation of the block effect caused if the thickness of the electron block layer 23 is too small. The thickness D23 is preferably not more than 50 nm. When the thickness D23 is not more than 50 nm, relaxation of the electron block layer 23 is suppressed and the electron block layer can involve strain.

The Al composition of the electron block layer 23 is preferably not less than 0.05 and preferably not more than 0.3. When the Al composition of the electron block layer 23 is less than 0.05, the block effect degrades. When the Al composition of the electron block layer 23 is not more than 0.3, the lattice relaxation is suppressed to avoid generation of dislocations at the lower interface of the electron block layer 23.

The second gallium nitride based semiconductor layer 25 is preferably comprised of GaN or InGaN. When the second gallium nitride based semiconductor layer 25 is comprised of a gallium nitride based semiconductor not containing Al (GaN or InGaN), it is feasible to prevent the electron block layer 23 from becoming lattice-relaxed by influence of the p-type cladding layer 17. Furthermore, GaN or InGaN enables the gallium nitride based semiconductor layer 25 to function as a guide layer. Similarly, the gallium nitride based semiconductor layer 21 is preferably comprised of GaN or InGaN. The gallium nitride based semiconductor layer 33 is preferably comprised of GaN or InGaN.

The thickness D25 of the second gallium nitride based semiconductor layer 25 is preferably not less than 30 nm. When the thickness D25 is not less than 30 nm, it is feasible to reduce lattice relaxation of the electron block layer 23 due to influence of the p-type cladding layer 17. The thickness D25 is preferably not more than 1 μm. When the thickness D25 is over 1 μm, the p-type cladding layer 17 becomes too far from the active layer 19, thereby failing to achieve excellent optical confinement.

The thickness D17 of the p-type cladding layer 17 is preferably not less than 300 nm. When the thickness D17 is not less than 300 nm, desired optical confinement performance is provided. The thickness D17 is preferably not more than 1.5 μm. When the thickness D17 is not more than 1.5 μm, it is a practical upper limit in view of throughput as well.

Since the misfit dislocation density at the interface 27a between the first gallium nitride based semiconductor layer 21 and the electron block layer 23 is smaller than that at the interface 27b between the second gallium nitride based semiconductor layer 25 and the p-type cladding layer 17, as described previously, the p-type cladding layer 17 is lattice-relaxed in part or in all on the semipolar plane of the semiconductor region 15.

The Al composition of the p-type cladding layer 17 can be not less than 0.03 and can be not more than 0.2. When the Al composition of the cladding layer 17 is not less than 0.03, desired optical confinement is provided. The Al composition of the cladding layer 17 is preferably not more than 0.2 in view of the crystallinity, electric conductivity, and throughput of the cladding layer 17. Even if lattice relaxation occurs in the cladding layer 17, there is little negative influence on the band bending in the electron block layer 23 in terms of carrier injection.

For example, based on the above-described Al composition, the following will describe the relationship between value $V170_T$ in an unstrained state of the transverse component $V17_T$ of the lattice constant vector LVC17 of the p-type cladding layer 17 and value $V250_T$ in an unstrained state of the transverse component $V25_T$ of the lattice constant vector LVC25 of the second gallium nitride based semiconductor layer 25. The lattice constant difference $(V170_T - V250_T)/V250_T$ between the second gallium nitride based semiconductor layer 25 and the p-type cladding layer 17 is preferably not less than −1.1% and preferably not more than −0.07%. The second gallium nitride based semiconductor layer 25 is comprised, for example, of GaN or InGaN and the In composition thereof is not less than 0 and not more than 0.03.

The misfit dislocation density at the interface (interface between the first gallium nitride based semiconductor layer 21 and the electron block layer 23) 27a is preferably less than $1 \times 10^4$ cm$^{-1}$. When the misfit dislocation density is in the foregoing range, it is feasible to reduce carrier overflow by virtue of band bending resulting from the strain of the electron block layer 23.

The misfit dislocation density at the interface (interface between the second gallium nitride based semiconductor layer 25 and the p-type cladding layer 17) 27b is preferably not less than $1 \times 10^4$ cm$^{-1}$. When the cladding layer 17 is lattice-relaxed in part or in all by increase in the thickness and Al composition of the cladding layer 17, improvement in optical confinement can be achieved in the cladding layer 17.

The thickness D17 of the p-type cladding layer 17 is preferably over the critical thickness in the Al composition of AlGaN of the p-type cladding layer 17. Since the p-type cladding layer 17 is formed on the semipolar plane, the p-type cladding layer 17 in the thickness of not less than the critical thickness is lattice-relaxed by action of a slip plane. For this reason, improvement in optical confinement can be achieved in the cladding layer without negative influence on carrier injection.

The misfit dislocation density at an interface 27c between the gallium nitride based semiconductor layer 25 and the electron block layer 23 is preferably less than $1 \times 10^4$ cm$^{-1}$. The misfit dislocation density at an interface 27d between the p-type contact layer 33 and the p-type cladding layer 17 is preferably less than $1 \times 10^4$ cm$^{-1}$.

In this nitride semiconductor light emitting device 11, the p-type cladding layer 17 is lattice-relaxed on the primary surface 15a of the semiconductor region 15. Hence, improvement in optical confinement can be achieved in the cladding layer 17.

As shown in FIG. 1, the nitride semiconductor light emitting device 11 may further comprise an n-type cladding layer 45 provided between the support substrate 13 and the semiconductor region 15. The n-type cladding layer 45 can contain AlGaN.

Figure 5:
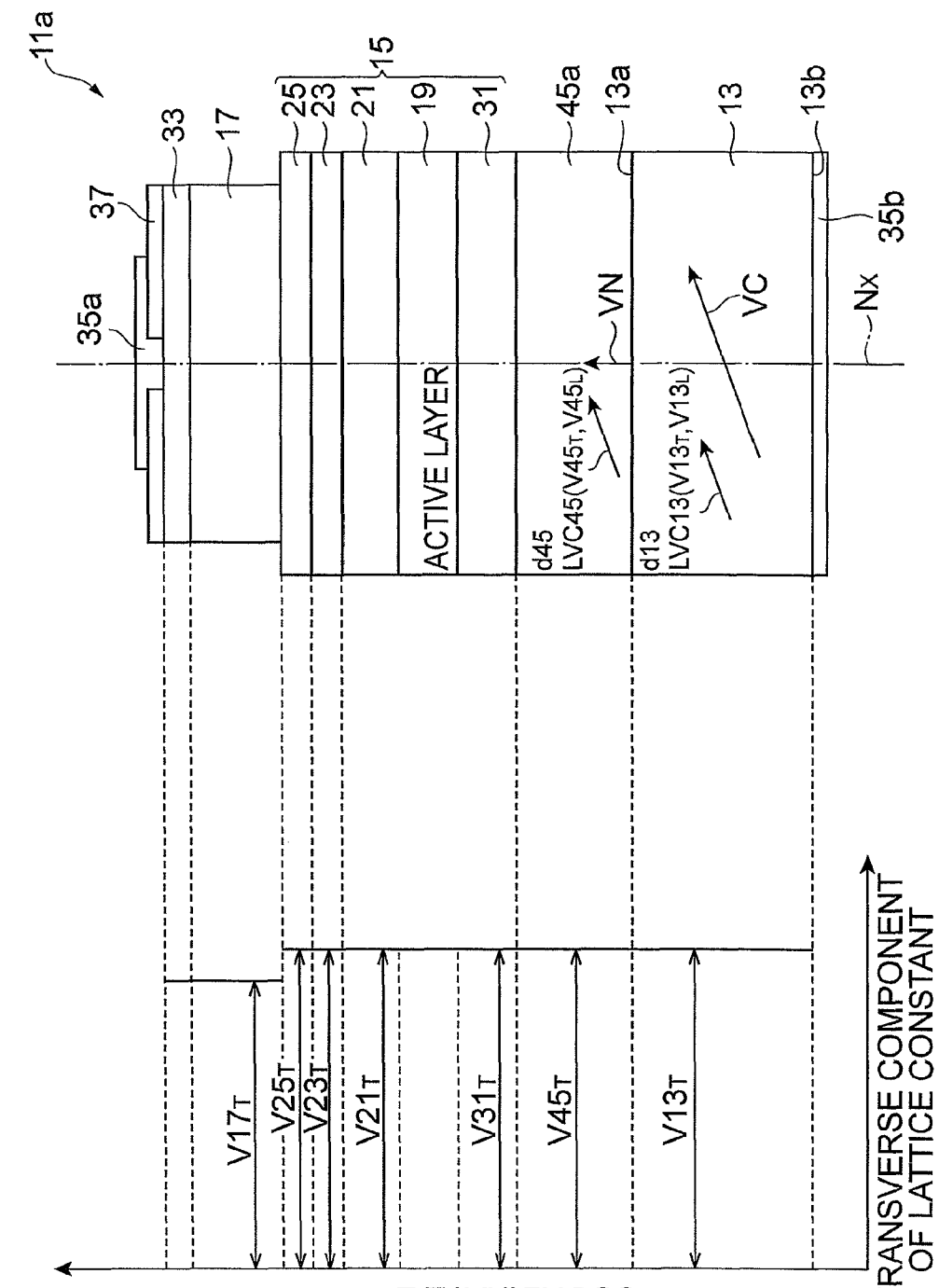
FIG. 5 is a drawing showing lattice constants in semiconductor layers of a nitride semiconductor light emitting device according to an embodiment.

In a nitride-based light emitting device 11a, as shown in FIG. 5, an n-type cladding layer 45a can comprise AlGaN. The n-type cladding layer 45a, gallium nitride based semiconductor layer 31, active layer 19, gallium nitride based semiconductor layer 21, electron block layer 23, and gallium nitride based semiconductor layer 25 are coherently grown on the primary surface 13a of the support substrate 13. Accordingly, the transverse components of the lattice constants of the support substrate 13, n-type cladding layer 45a, gallium nitride based semiconductor layer 31, active layer 19, gallium nitride based semiconductor layer 21, electron block layer 23, and gallium nitride based semiconductor layer 25 are equal to each other.

The n-type cladding layer 45a is not lattice-relaxed but strained according to the difference between the lattice constant of the n-type cladding layer 45a and the lattice constant of the support substrate 13. The semiconductor region 15 including the electron block layer 23 is formed on the strained n-type cladding layer 45a. For this reason, the electron block layer 23 is subject to tensile strain and band bending occurs in a direction to reduce the carrier overflow.

In terms of the notation of lattice vectors above, a c-axis direction in the gallium nitride based semiconductor of the gallium nitride based semiconductor layer 45a and a magnitude of lattice constant d45 in the c-axis direction are represented by a lattice vector LVC45. The lattice vector LVC45 has a longitudinal component $V45_L$ in the direction of the normal axis Nx and a transverse component $V45_T$ perpendicular to the longitudinal component.

A c-axis direction in the gallium nitride based semiconductor of the gallium nitride based semiconductor layer 13 and a magnitude of lattice constant d13 in the c-axis direction are represented by a lattice vector LVC13. The lattice vector LVC13 has a longitudinal component $V13_L$, in the direction of the normal axis Nx and a transverse component $V13_T$ perpendicular to the longitudinal component. The n-type cladding layer 45a is subject to tensile strain on the primary surface 13a of the support substrate 13.

Figure 6:
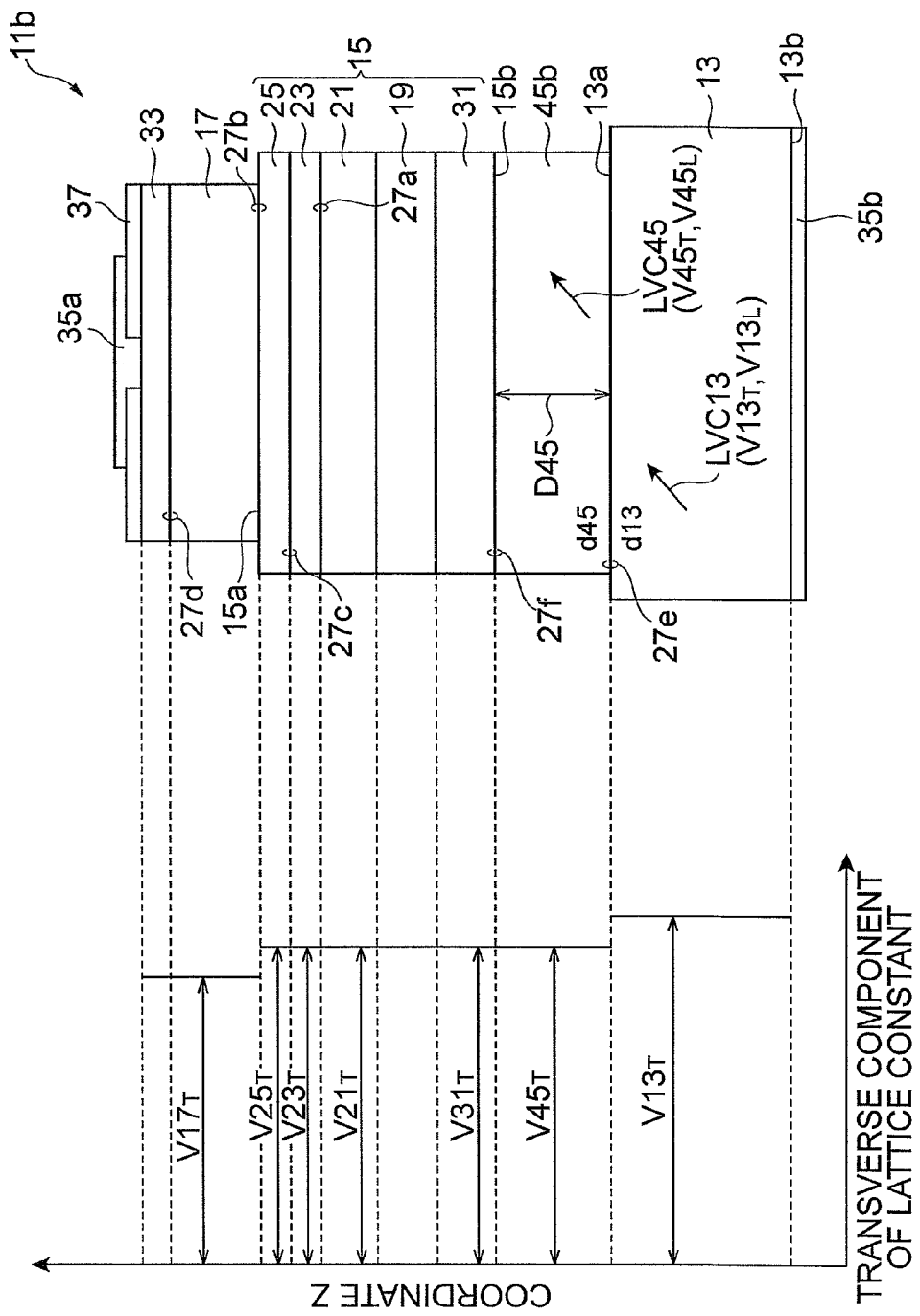
FIG. 6 is a drawing showing lattice constants in semiconductor layers of a nitride semiconductor light emitting device according to an embodiment.

In a nitride-based light emitting device 11b, as shown in FIG. 6, an n-type cladding layer 45b can comprise AlGaN. The transverse component $V13_T$ of the lattice constant of the support substrate 13 is larger than the transverse component $V45_T$ of the lattice constant of the n-type cladding layer 45b. In order to show this relation of the transverse components in the semiconductor layers of the nitride semiconductor light emitting device on the right side of FIG. 6, the lateral width of the n-type cladding layer 45b is depicted so as to be smaller than the lateral width of the support substrate 13. The gallium nitride based semiconductor layer 31, active layer 19, gallium nitride based semiconductor layer 21, electron block layer 23, and gallium nitride based semiconductor layer 25 are coherently grown on the n-type cladding layer 45b. For this reason, the transverse components of the lattice constants of the n-type cladding layer 45b, gallium nitride based semiconductor layer 31, active layer 19, gallium nitride based semiconductor layer 21, electron block layer 23, and gallium nitride based semiconductor layer 25 are substantially equal to each other.

The misfit dislocation density at an interface 27e between the n-type cladding layer 45b and the primary surface 13a of the support substrate 13 is larger than that at an interface 27f between the n-type cladding layer 45b and the lower surface 15b of the semiconductor region 15. The n-type cladding layer 45b is lattice-relaxed on the primary surface 13a of the support substrate 13 and is strained according to the difference between the lattice constant of the n-type cladding layer 45b and the lattice constant of the support substrate 13. The semiconductor region 15 including the active layer 19 is formed on the n-type cladding layer 45b the strain of which is freed in part or in all by lattice relaxation. The strain of the semiconductor region 15 is affected by the lattice constant of the n-type cladding layer 45b the strain of which is freed. The electron block layer 23 is provided on the semiconductor region 15. The electron block layer 23 is affected by the strain of the n- type cladding layer 45b.

The thickness D45 of the n-type cladding layer 45b is preferably over the critical thickness in the Al composition of AlGaN of the n-type cladding layer 45b. Accordingly, lattice relaxation occurs in the n-type cladding layer 45b. The semiconductor region 15 including the first gallium nitride based semiconductor layer 21 is formed on the lattice-relaxed n-type cladding layer 45b. For this reason, the first gallium nitride based semiconductor layer 21 is subject to compressive strain and the bending of the band thereof occurs in the direction in which the carrier overflow is reduced.

Figure 7:
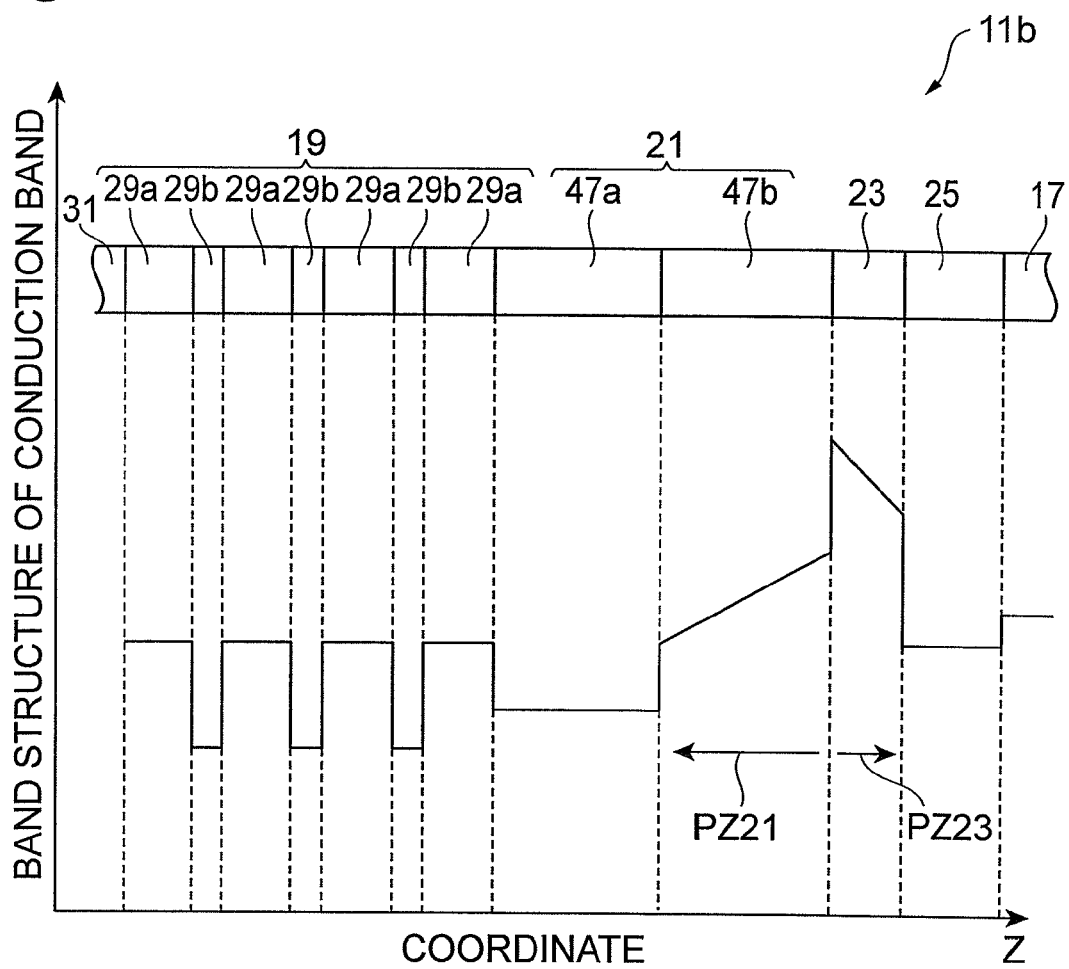
FIG. 7 is a drawing showing an example of conduction band structure in a nitride semiconductor light emitting device according to an embodiment.

FIG. 7 is a drawing showing a conduction band structure of a nitride semiconductor light emitting device formed on a lattice-relaxed n-type cladding layer. As shown in FIG. 6, the compressive strain of the gallium nitride based semiconductor layer 21 immediately below the electron block layer 23 becomes stronger by lattice relaxation of the n-type cladding layer 45b. For this reason, the band bending is enhanced in the electron block layer 23, whereby the piezoelectric polarizations (PZ21, PZ23) in the electron block layer 23 and the gallium nitride based semiconductor layer 21 act in the direction to further reduce the carrier overflow (carriers in the present embodiment are electrons).

Figure 8:
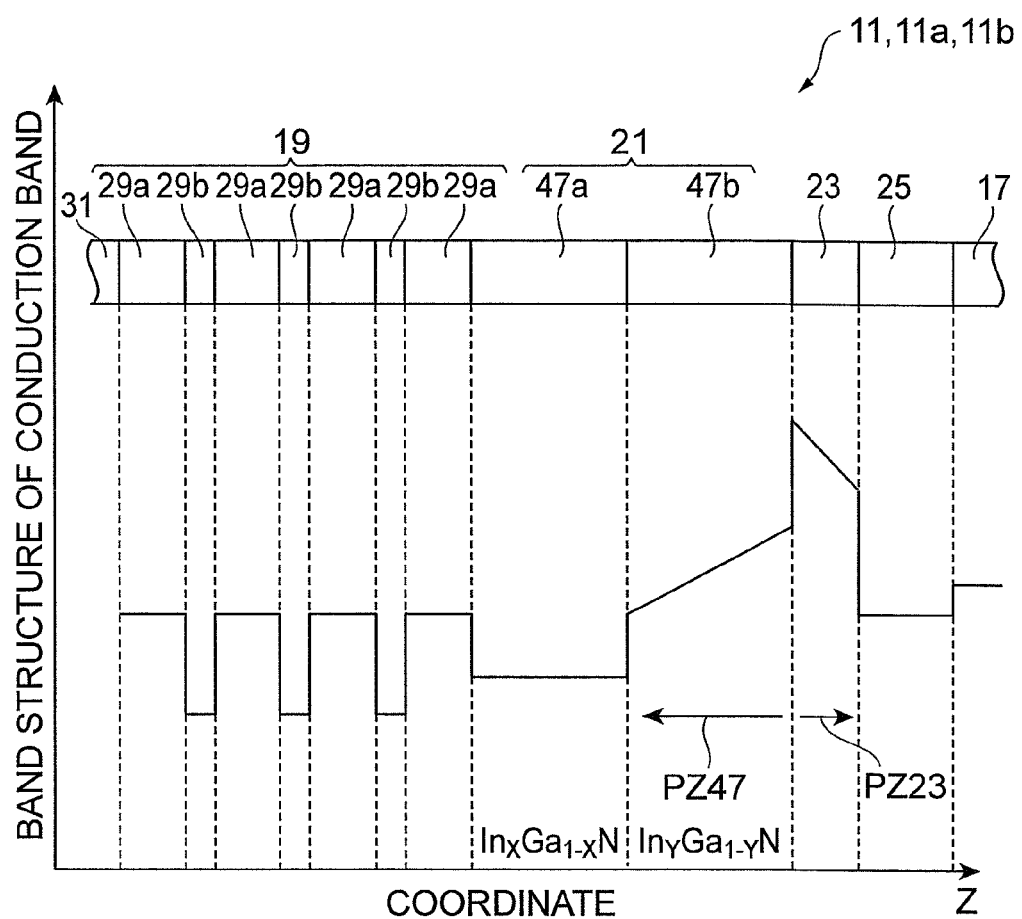
FIG. 8 is a drawing showing another example of conduction band structure in a nitride semiconductor light emitting device according to an embodiment.

As shown in FIG. 1, the gallium nitride based semiconductor layer 21 can be comprised of a gallium nitride based semiconductor having a single composition. However, as shown in FIGS. 2 and 7, the gallium nitride based semiconductor layer 21 can include a first part 47a and a second part 47b. As shown in FIG. 8, the bandgap of the first part 47a is preferably smaller than the bandgap of the second part 47b. The refractive index of the first part 47a is preferably larger than that of the second part 47b. The transverse component of the lattice constant in an unstrained state in the first part 47a is preferably larger than the transverse component of the lattice constant in an unstrained state in the second part 47b. When the first part 47a comprises $In_XGa_{1-X}N$ (0<X<1) and the second part 47b comprises $In_YGa_{1-Y}N$ (0<Y<X<1), compressive strain becomes stronger in the gallium nitride based semiconductor layer 21 immediately below the electron block layer 23. For this reason, the band bending is enhanced in the electron block layer 23, whereby the piezoelectric polarizations (PZ47, PZ23) in the electron block layer 23 and the gallium nitride based semiconductor layer 21 act in the direction to further reduce the carrier overflow (carriers in the present embodiment are electrons).

In an embodiment, the n-type cladding layer 45 can include an InAlGaN layer. The first gallium nitride based semiconductor layer 21 is comprised of InGaN. Since the n-type cladding layer 45 includes the InAlGaN layer, it can provide the n-type cladding layer 45 with the bandgap and thickness more suitable for the cladding and make the lattice constant of the InAlGaN layer closer to the lattice constant of GaN than a cladding layer made of AlGaN. The use of the InAlGaN layer makes the lattice relaxation less likely to occur even in the case where the first gallium nitride based semiconductor layer 21 is made of InGaN, and allows the first gallium nitride based semiconductor layer 21 to be subject to compressive stress.

EXAMPLE 1

Figure 9:
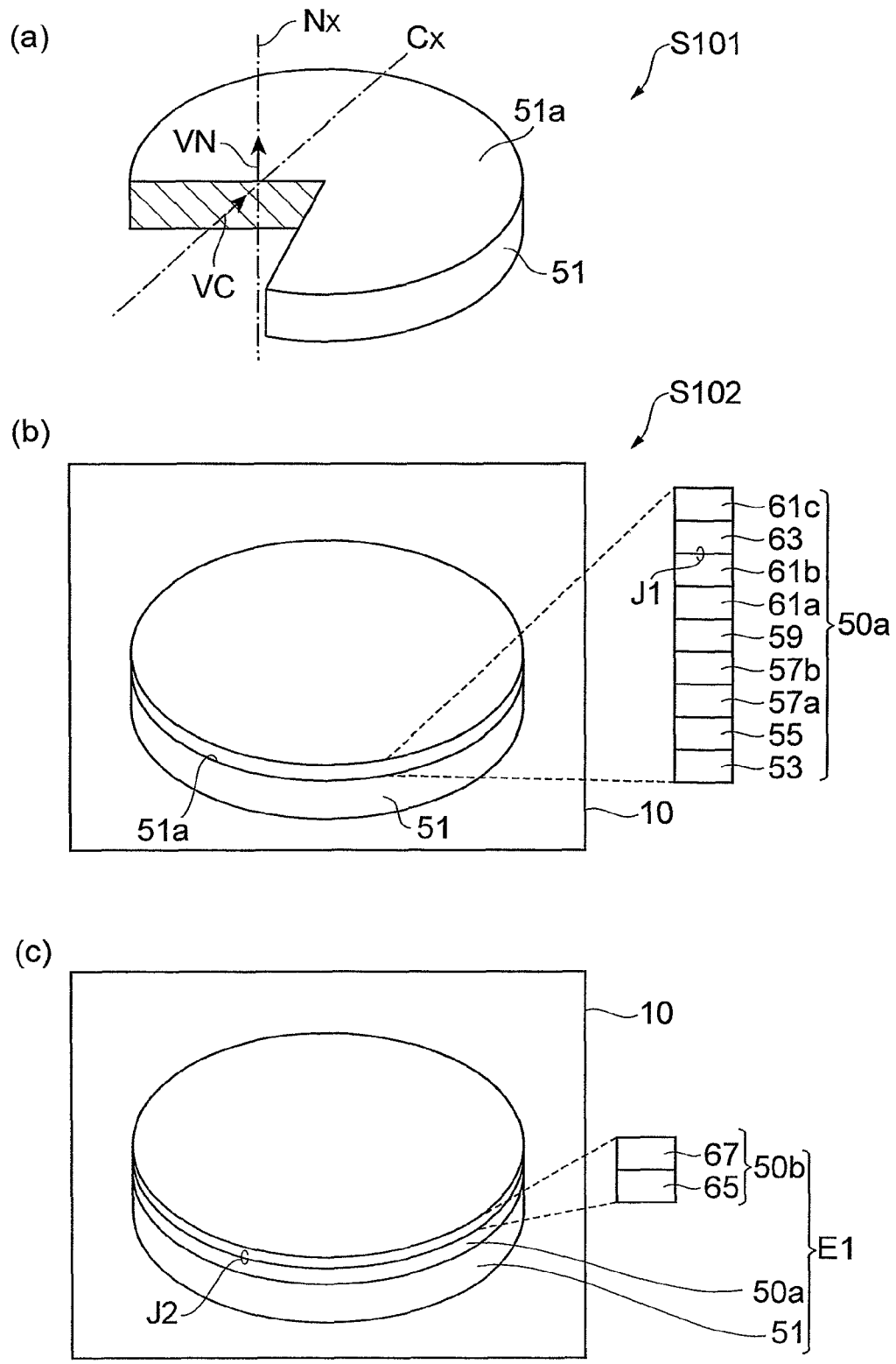
FIG. 9 is a drawing schematically showing major steps in a method for fabricating a nitride semiconductor light emitting device according to an embodiment.

A method of fabricating a nitride laser diode will be described with reference to FIG. 9. This nitride laser diode has an LD structure shown in FIG. 10(a). In step S101, a GaN substrate 51 having a semipolar plane is prepared. A primary surface 51a of this GaN substrate 51 is inclined at 75 degrees to the m-axis direction. In the subsequent description, the laser diode (LD) structure to emit light in the 450 nm band is produced on a (20-21) plane of this semipolar GaN substrate. With reference to FIG. 9(a), there are a normal vector VN and a c-axis vector shown along with the normal axis Nx and the c-axis Cx of the primary surface 51a. Subsequently, plural gallium nitride based semiconductor layers are grown on the GaN substrate 51 by organometallic vapor phase epitaxy to produce an epitaxial substrate. The raw materials used are as follows: trimethyl gallium (TMG), trimethyl aluminum (TMA); trimethyl indium (TME); and ammonia ($NH_3$).

Dopant gases used are as follows: silane ($SiH_4$); and bis (cyclopentadienyl) magnesium ($Cp_2Mg$).

Step S102 is carried out in order to place the GaN substrate 51 in a growth reactor 10. Thermal cleaning of the GaN substrate 51 is carried out using the growth reactor 10. At the temperature of 1050 Celsius degrees, a thermal treatment is carried out for ten minutes under flow of gas containing $NH_3$ and $H_2$ in the growth reactor 10. In a growth step after the thermal cleaning, raw material gases are supplied to the growth reactor 10 to grow an n-type GaN buffer layer (1 μm thick) 53 and an n-type $Al_{0.04}Ga_{0.96}N$ cladding layer (1 μm thick) 55 on the primary surface 51a of the GaN substrate 51, at 1100 Celsius degrees. The presence/absence of lattice relaxation on the semipolar plane can be controlled by the composition, thickness, and lattice constant difference of the AlGaN semiconductor to be grown, and the AlGaN semiconductor is not relaxed in the present example. At the same temperature, an n-type GaN optical guide layer (150 nm thick) 57a is then grown thereon. Thereafter, at the temperature of 840 Celsius degrees, an undoped $In_{0.02}Ga_{0.98}N$ optical guide layer (50 nm thick) 57b is grown thereon. An active layer 59 of a quantum well structure is grown on the optical guide layer 57b. The active layer 59 includes alternately arranged well layers and barrier layers, and the number of well layers is three. The growth temperature of the InGaN well layers is 790 Celsius degrees and the thickness thereof is 3 nm. The growth temperature of the InGaN barrier layers is 840 Celsius degrees and the thickness thereof is 15 nm. After completion of growth of the last barrier layer, an undoped $In_{0.02}Ga_{0.98}N$ optical guide layer (50 nm thick) 61a is then grown at the same temperature. Thereafter, a p-type GaN optical guide layer (50 nm thick) 61b is grown on the optical guide layer 61a at the temperature of 1000 Celsius degrees. At the same temperature, a p-type $Al_{0.12}Ga_{0.88}N$ electron block layer (20 nm thick) 63 is grown on the optical guide layer 61b. At the same temperature, a p-type GaN optical guide layer (100 nm thick) 61c is grown on the electron block layer 63.

In step S103, a p-type $Al_{0.05}G_{0.95}N$ cladding layer (400 nm thick) 65 and a p-type GaN contact layer (50 nm thick) 67 are grown on the optical guide layer 61c at the temperature of 1000 Celsius degrees in the growth reactor 10. This process produces an epitaxial substrate E1. In the epitaxial substrate E1, the thickness of the GaN optical guide layer is larger than the thickness of the InGaN optical guide layer.

There are no misfit dislocations observed at the lower interface J1 of the electron block layer 63. The thickness of the p-type $Al_{0.05}Ga_{0.95}N$ cladding layer 65 is larger than the critical thickness of AlGaN in this Al composition. Since the cladding layer 65 is lattice-relaxed, a large number of dislocations (e.g., misfit dislocations) are generated at the junction J2 between the optical guide layer 61c and the cladding layer 65. On the other hand, there are misfit dislocations observed in the density of $3 \times 10^4$ $cm^{-1}$ at the lower interface J2 of the p-type cladding layer 65.

Figure 10:
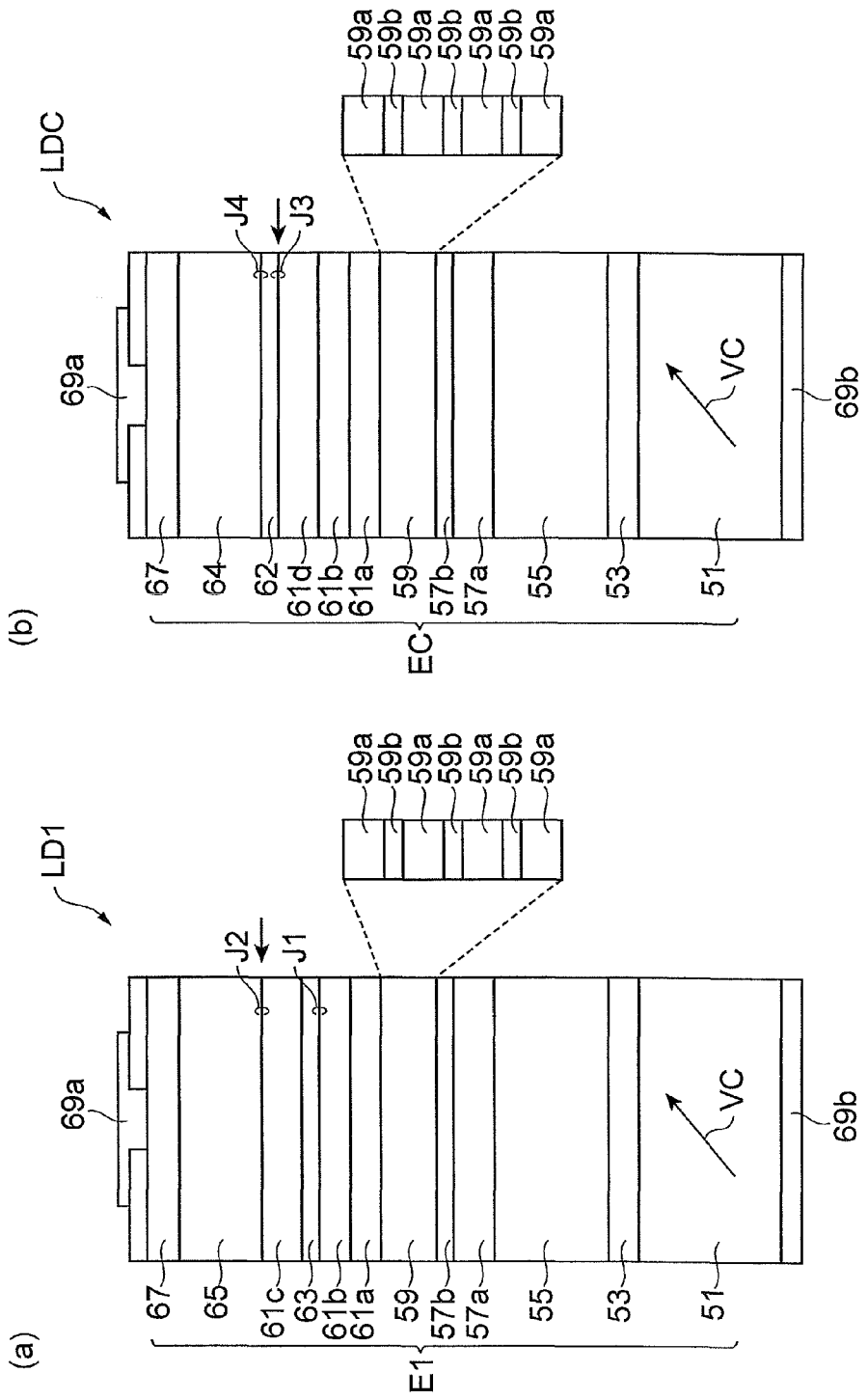
FIG. 10 is a drawing schematically showing structures of nitride semiconductor light emitting devices in examples.

As a comparative example, an LD structure is produced in which the electron block layer and the p-type GaN guide layer are replaced with each other, as shown in FIG. 10(b). In order to form this structure, a p-type GaN optical guide layer (100 nm thick) 61d is grown at the same temperature on the optical guide layer 61b. A p-type $Al_{0.12}Ga_{0.88}N$ electron block layer (20 nm thick) 62 is grown on the optical guide layer 61d. Thereafter, at the temperature of 1000 Celsius degrees, a p-type $Al_{0.05}Ga_{0.95}N$ cladding layer (400 nm thick) 64 and a p-type GaN contact layer (50 nm thick) 67 are grown on the electron block layer 62. This process produces an epitaxial substrate EC.

The misfit dislocations at the interface J3 immediately below the electron block layer 62 are $5 \times 10^4$ $cm^{-1}$. There are no misfit dislocations formed at the interface J4 immediately below the p-type cladding layer 64. When the electron block layer 62 and the p-type cladding layer 64 are continuously fowled like the epitaxial substrate EC, misfit dislocations are introduced to immediately below the electron block layer 62. However, since the electron block layer 63 and the p-type cladding layer 65 are isolated from each other by the p-type GaN guide layer 61c in the epitaxial substrate E1, misfit dislocations are not introduced to the interface J1 immediately below the thin electron block layer 63 but are introduced to the interface J2 immediately below the thick p-type cladding layer 65.

An electrode step is carried out to form a p-side electrode 69a of Ni/Au and a pad electrode of Ti/Au in a stripe window of a silicon oxide film in the epitaxial substrates E1 and EC. An n-side electrode 69b of Ti/Al and a pad electrode of Ti/Au are formed on the back surface of the GaN substrate 51. These electrodes are formed by vapor deposition. Through these steps, substrate products P1, PC are produced from the epitaxial substrates E1 and EC. The substrate products P1, PC are cleaved at intervals of 800 μm to produce gain-guiding type lasers LD1, LDC, respectively. A dielectric multilayer film of $SiO_2/TiO_2$ is formed on cleaved facets.

Lasing oscillation in LD1 of the example occurs at the threshold current of 800 mA, whereas LDC of the comparative example did not lase. When intensities of spontaneous emissions of these lasers are compared therewith, the intensity of light in LDC of the comparative example is about one half lower than the intensity of light in LD1 of the example. This is considered to be the cause to impede lasing and it is considered in the case of LDC of the comparative example that strain of the electron block layer is relaxed to make the carrier overflow likely to occur, thereby causing reduction in luminous efficiency.

EXAMPLE 2

Figure 11:
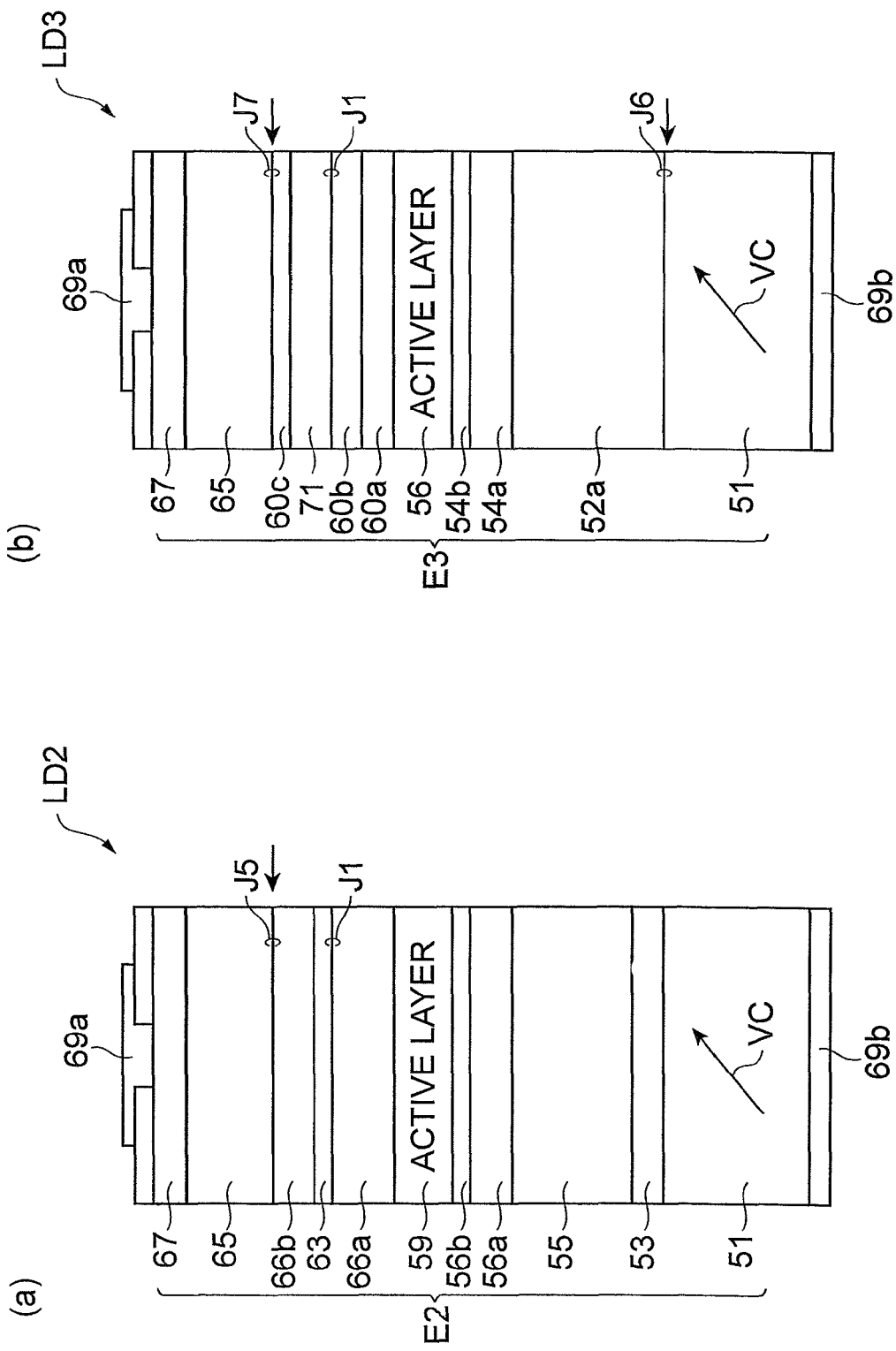
FIG. 11 is a drawing schematically showing structures of nitride semiconductor light emitting devices in examples.

In this example, LD2 shown in FIG. 11(a) is produced. On the n-type cladding layer 55, an n-type GaN optical guide layer (100 nm thick) 56a is then grown at the same temperature. Thereafter, at the temperature of 840 Celsius degrees, an undoped $In_{0.02}Ga_{0.98}N$ optical guide layer (100 nm thick) 56b is grown. An active layer 59 of a quantum well structure is grown on the optical guide layer 56. After completion of growth of the last barrier layer, an undoped $In_{0.02}Ga_{0.98}N$ optical guide layer (100 nm thick) 66a is then grown at the same temperature. Thereafter, a p-type $Al_{0.12}Ga_{0.88}N$ electron block layer (20 nm thick) 63 is grown on the optical guide layer 66a. At the same temperature, a p-type GaN optical guide layer (100 nm thick) 66b is grown on the electron block layer 63. A p-type $Al_{0.05}Ga_{0.95}N$ cladding layer (400 nm thick) 65 and a p-type GaN contact layer (50 nm thick) 67 are grown on the optical guide layer 66b at the temperature of 1000 Celsius degrees in the growth reactor 10. This process produces an epitaxial substrate E2. In the epitaxial substrate E2, the thickness of the GaN optical guide layer is equal to the thickness of the InGaN optical guide layer.

There are no misfit dislocations observed at the lower interface J1 of the electron block layer 63. Since the cladding layer 65 is lattice-relaxed, a large number of dislocations (e.g., misfit dislocations) are generated at the junction J2 between the optical guide layer 66b and the cladding layer 65. On the other hand, there are misfit dislocations observed in the density of $3 \times 10^4$ $cm^{-1}$ at the lower interface J5 of the p-type cladding layer 65.

LD2 of this example lases at the threshold current of 600 mA. Since the InGaN guide layer immediately below the electron block layer is subject to compressive strain in the present example, the band is considered to be bent in the direction in which the carrier overflow can be further suppressed.

EXAMPLE 3

Figure 12:
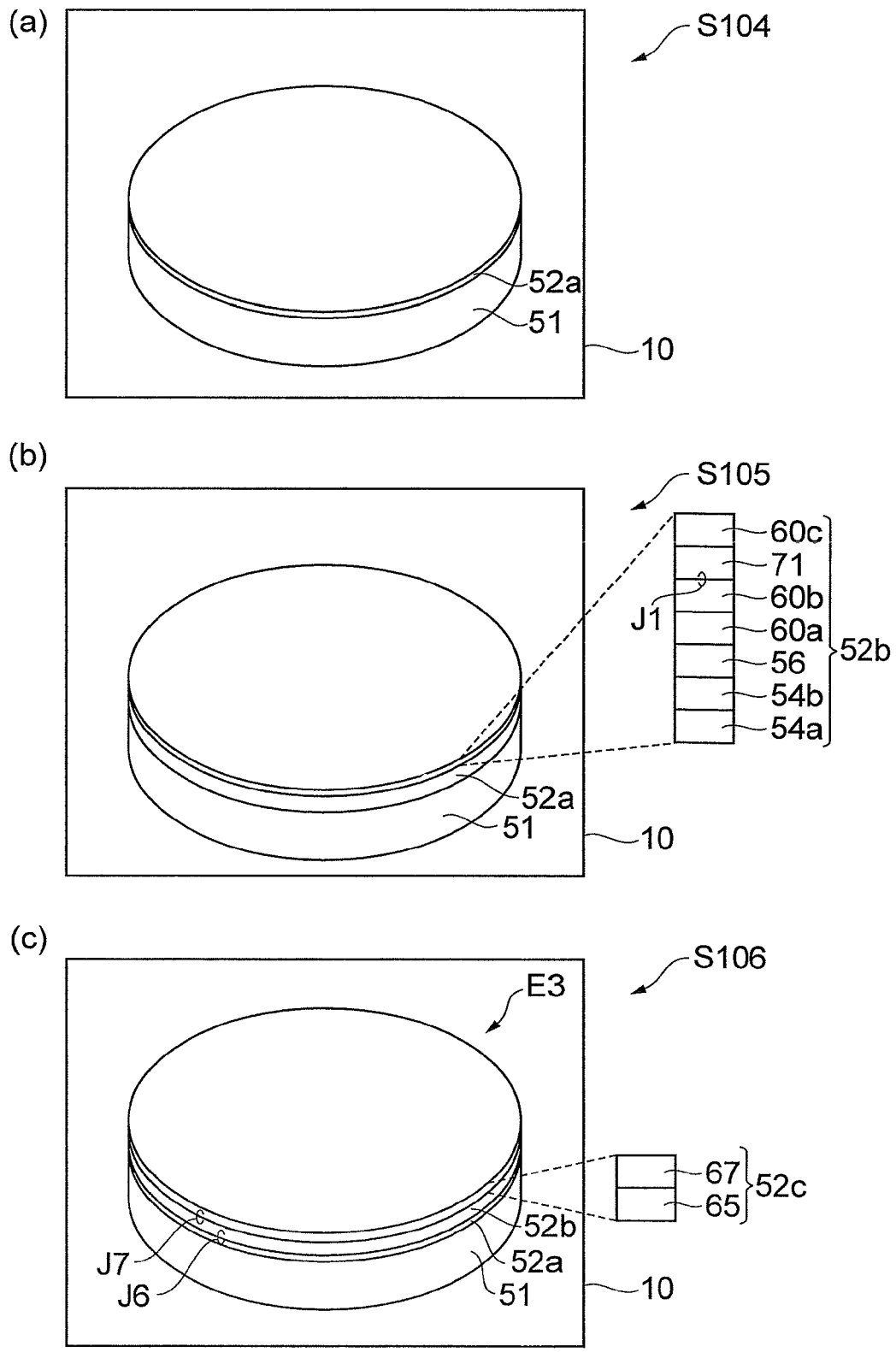
FIG. 12 is a drawing schematically showing major steps in a method for fabricating a nitride semiconductor light emitting device according to an embodiment.

In this example, LD3 shown in FIG. 11(b) is produced. After step S101, step S104 is carried out to place the GaN substrate 51 in the growth reactor 10, as shown in FIG. 12(a). Thermal cleaning of the GaN substrate 51 is carried out using the growth reactor 10. A thermal treatment is carried out at the temperature of 1050 Celsius degrees for ten minutes under flow of gas containing $NH_3$ and $H_2$ in the growth reactor 10. In a growth step after the thermal cleaning, raw material gases are supplied to the growth reactor 10 to grow an n-type $Al_{0.06}Ga_{0.94}N$ cladding layer (2 μm thick) 52a at 1100 Celsius degrees on the primary surface 51a of the GaN substrate 51. The presence/absence of lattice relaxation on the semipolar plane can be controlled by the composition, thickness, and lattice constant difference of the AlGaN semiconductor to be grown, and in the present example the AlGaN semiconductor is relaxed.

In step S105, a semiconductor region 52b is grown thereon. At the same temperature, an n-type GaN optical guide layer (150 nm thick) 54a is then grown on the n-type cladding layer 52a. Thereafter, at the temperature of 840 Celsius degrees, an undoped $In_{0.02}Ga_{0.98}N$ optical guide layer (50 nm thick) 54b is grown. An active layer 56 of a quantum well structure is grown on the optical guide layer 54b. The active layer 56 includes alternately arranged well layers and barrier layers and the number of well layers is three. The growth temperature of the well layers is 790 Celsius degrees and the thickness thereof is 3 nm. The growth temperature of the barrier layers is 840 Celsius degrees and the thickness thereof is 15 nm. After completion of the growth of the last barrier layer, an undoped $In_{0.02}Ga_{0.98}N$ optical guide layer (50 nm thick) 60a is then grown at the same temperature. Thereafter, at the temperature of 1000 Celsius degrees, a p-type GaN optical guide layer (50 nm thick) 60b is grown on the optical guide layer 60a. At the same temperature, a p-type $Al_{0.12}Ga_{0.88}N$ electron block layer (20 nm thick) 71 is grown on the optical guide layer 60b. At the same temperature, a p-type GaN optical guide layer (100 nm thick) 60c is grown on the electron block layer 71.

In step S106, a lattice-relaxed p-type gallium nitride based semiconductor region is grown on the semiconductor region 52b. A p-type $Al_{0.05}Ga_{0.95}N$ cladding layer (400 nm thick) 65 and a p-type GaN contact layer (50 nm thick) 67 are grown on the optical guide layer 60c at the temperature of 1000 Celsius degrees in the growth reactor 10. This process produces an epitaxial substrate E3.

There are no misfit dislocations observed at the lower interface J1 of the electron block layer 71. The thickness of the n-type $Al_{0.06}Ga_{0.94}N$ cladding layer 52a is larger than the critical thickness of AlGaN in this Al composition. Since the cladding layer 52a is lattice-relaxed, a large number of dislocations (e.g., misfit dislocations) are generated at a junction J6 between the optical guide layer 54a and the n-type cladding layer 52a, and misfit dislocations are observed thereat in the density of $3 \times 10^4$ cm$^{-1}$.

The thickness of the p-type $Al_{0.05}Ga_{0.95}N$ cladding layer 65 is larger than the critical thickness of AlGaN in this Al composition. Since the cladding layer 65 is lattice-relaxed, a large number of dislocations (e.g., misfit dislocations) are generated at a junction J7 between the optical guide layer 60c and the cladding layer 65 and misfit dislocations thereat are observed in the density of $3 \times 10^4$ cm$^{-1}$.

In this epitaxial substrate E3, the electrodes are formed in the same manner as in Example 1 and it is cleaved to produce a guiding type laser diode LD3. Characteristics of the laser diode LD3 are approximately equal to those of the laser diode LD2 and are better than those of the laser diode LD1 in Example 1. In the laser diode LD3, the relaxation of the n-type AlGaN cladding layer proceeds and the GaN guide layer immediately below the electron block layer is subject to greater compressive strain; therefore, the band is considered to be bent in the direction in which to the carrier overflow can be further suppressed.

EXAMPLE 4

Figure 13:
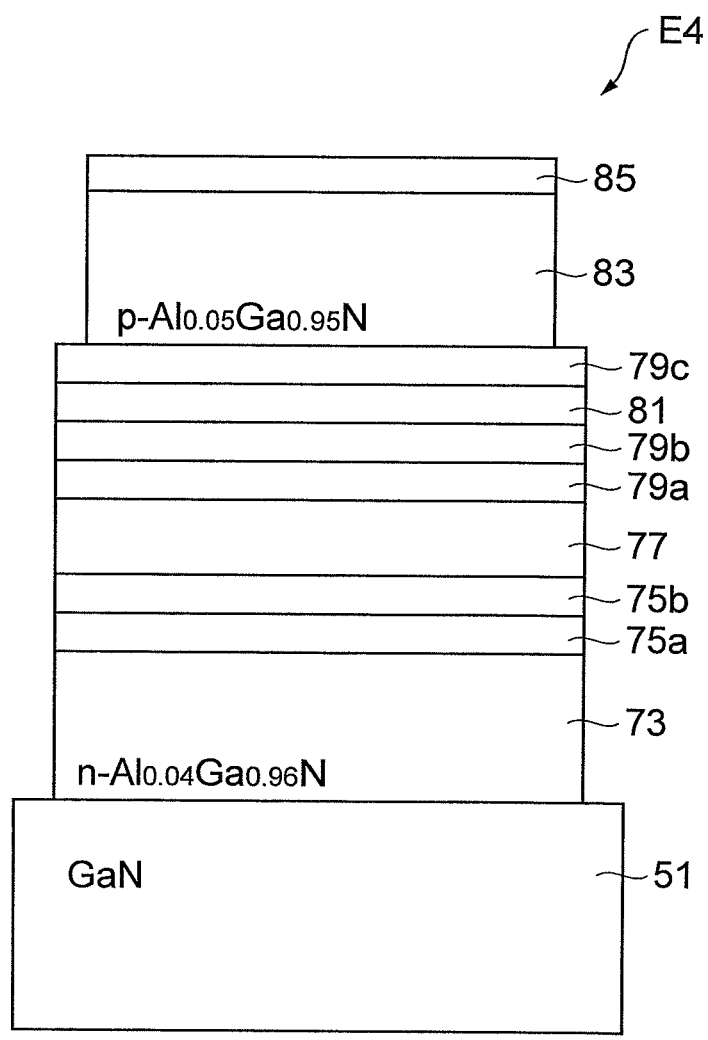
FIG. 13 is a drawing schematically showing a structure of a nitride semiconductor light emitting device in an example.

In this example, an epitaxial substrate E4 shown in FIG. 13 is produced. A substrate prepared is the GaN substrate 51 having the primary surface with the 75 degrees off angle. The following gallium nitride based semiconductor films are grown on this GaN substrate 51: n-type $Al_{0.04}Ga_{0.96}N$ cladding layer (2300 nm thick) 73, n-type GaN optical guide layer (50 nm thick) 75a, undoped $In_{0.01}Ga_{0.99}N$ layer (50 nm thick) 75b, InGaN/GaN active layer (well layers 3 nm and barrier layers 15 nm) 77, undoped $In_{0.01}Ga_{0.99}N$ optical guide layer (50 nm thick) 79a, p-type GaN optical guide layer (50 nm thick) 79b, p-type $Al_{0.12}Ga_{0.88}N$ electron block layer (20 nm thick) 81, p-type GaN optical guide layer (50 nm thick) 79c, p-type $Al_{0.05}Ga_{0.95}N$ cladding layer (400 nm thick) 83, and p-type GaN contact layer (50 nm thick) 85. The epitaxial substrate E4 is produced by the growth of these layers. In FIG. 13, the lateral widths of the above semiconductor layers and GaN substrate show the relationship among magnitudes of the transverse components of the lattice constants in the adjacent semiconductors as in FIG. 4.

Figure 14:
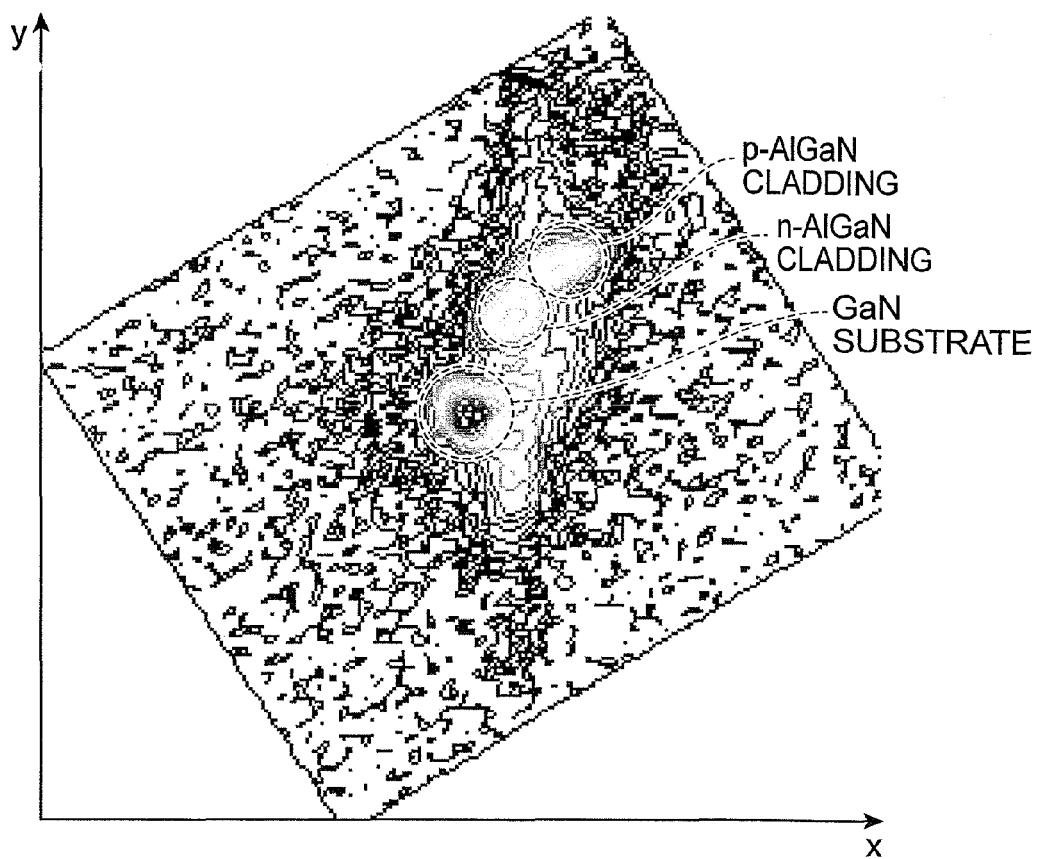
FIG. 14 is a drawing showing reciprocal lattice mapping of (20-24) in an epitaxial substrate.

FIG. 14 is a drawing showing reciprocal lattice mapping of (20-24) in the epitaxial substrate. A direction of incidence of X-ray is a direction parallel to the inclination direction of the c-axis. A diffraction spot of the n-type AlGaN cladding layer is shifted from a diffraction spot of the GaN substrate and thus the n-type AlGaN cladding layer is lattice-relaxed. A diffraction spot of the p-type AlGaN cladding layer is shifted from the diffraction spot of the n-type AlGaN cladding layer and the diffraction spot of the GaN substrate. Namely, since the three diffraction spots are not aligned on a straight line parallel to the y-axis, these three semiconductors are not in a lattice-matched state.

Having been illustrated and described the principle of the present invention in the preferred embodiments, but it should be noted that it is recognized by those skilled in the art that the present invention can be modified in arrangement and detail without departing from the principle. The present invention is by no means intended to be limited to the specific configurations disclosed in the embodiments. Therefore, the applicant claims all modifications and changes falling within the scope of claims and resulting from the scope of spirit thereof.

Industrial Applicability

As described above, the embodiments provide the nitride semiconductor light emitting devices capable of reducing the degradation of carrier block performance due to the lattice relaxation. Furthermore, the embodiments provide the epitaxial substrates for the nitride semiconductor light emitting devices.

REFERENCE SIGNS LIST 11, 11a, 11b Nitride Semiconductor Light Emitting Devices; 3 . . . Support Substrate;

13a ... Primary Surface of Support Substrate;
15 ... Semiconductor Region;
17 ... P-type Cladding Layer;
S ... Orthogonal Coordinate System;
VC ... C-axis Vector;
NV ... Normal Vector;
19 ... Active Layer;
21 ... First Gallium Nitride Based Semiconductor Layer;
23 ... Electron Block Layer;
25 ... Second Gallium Nitride Based Semiconductor Layer;
27a, 27b, 27c, 27d, 27e, 27f ... Interfaces;
29 ... Quantum Well Structure;
29a ... Barrier Layers;
29b ... Well Layers;
31 ... Third Gallium Nitride Based Semiconductor Layer;
33 ... P-type Contact Layer;
35a P-side Electrode;
37 ... Insulating Film;
35b N-side Electrode;
d13, d17, d21, d23, d25, d31 ... Lattice Constants;
LVC13, LVC17, LVC21, LVC23, LVC25, LVC45 ... Lattice Vectors;
$V13_L, V17_L, V21_L, V23_L, V25_L, V31_L, V45_L$ ... Longitudinal Components;
$V13_T, V17_T, V21_T, V23_T, V25_T, V31_T, V45_T$ ... Transverse Components;
45, 45a, 45b ... N-type Cladding Layers.

The invention claimed is:

1. A nitride semiconductor light emitting device comprising:
    a support substrate comprising a hexagonal gallium nitride semiconductor;
    a semiconductor region comprising an active layer, a first gallium nitride-based semiconductor layer, an electron block layer, and a second gallium nitride-based semiconductor layer, the semiconductor region being provided on a primary surface of the support substrate; and
    a p-type cladding layer provided on a primary surface of the semiconductor region,
    a c-axis of the hexagonal gallium nitride semiconductor being inclined to a predetermined direction with respect to a normal axis to the primary surface of the support substrate,
    the p-type cladding layer comprising AlGaN,
    the electron block layer comprising AlGaN,
    the first gallium nitride-based semiconductor layer being provided between the active layer and the electron block layer,
    the second gallium nitride-based semiconductor layer being provided between the p-type cladding layer and the electron block layer,
    a material of the second gallium nitride-based semiconductor layer being different from a material of the electron block layer,
    the material of the second gallium nitride-based semiconductor layer being different from a material of the p-type cladding layer,
    a bandgap of the first gallium nitride-based semiconductor layer being smaller than a bandgap of the electron block layer,
    the electron block layer is subject to tensile strain in the predetermined direction,
    the first gallium nitride-based semiconductor layer being subject to compressive strain in the predetermined direction, and
    a misfit dislocation density at an interface between the first gallium nitride-based semiconductor layer and the electron block layer being smaller than a misfit dislocation density at an interface between the second gallium nitride-based semiconductor layer and the p-type cladding layer.

2. The nitride semiconductor light emitting device according to claim 1,
    wherein a refractive index of the second gallium nitride-based semiconductor layer is larger than a refractive index of the electron block layer, and
    wherein the refractive index of the second gallium nitride-based semiconductor layer is larger than a refractive index of the p-type cladding layer.

3. The nitride semiconductor light emitting device according to claim 1, wherein the second gallium nitride-based semiconductor layer comprises at least one of GaN and InGaN.

4. The nitride semiconductor light emitting device according to claim 1, wherein a thickness of the second gallium nitride-based semiconductor layer is not less than 30 nm and not more than 1 μm.

5. The nitride semiconductor light emitting device according to claim 1, wherein a thickness of the electron block layer is not less than 5 nm and not more than 50nm.

6. The nitride semiconductor light emitting device according to claim 1, wherein a thickness of the p-type cladding layer is not less than 300 nm and not more than 1.5 μm.

7. The nitride semiconductor light emitting device according to claim 1, wherein an Al composition of the electron block layer is not less than 0.05 and not more than 0.3.

8. The nitride semiconductor light emitting device according to claim 1, wherein an Al composition of the p-type cladding layer is not less than 0.03 and not more than 0.2.

9. The nitride semiconductor light emitting device according to claim 1, wherein the misfit dislocation density at the interface between the second gallium nitride-based semiconductor layer and the p-type cladding layer is not less than $1 \times 10^4$ cm$^{-1}$, and
    wherein the misfit dislocation density at the interface between the first gallium nitride-based semiconductor layer and the electron block layer is less than $1 \times 10^4$ cm$^{-1}$.

10. The nitride semiconductor light emitting device according to claim 1, wherein the p-type cladding layer is lattice-relaxed on the semiconductor region at least in the predetermined direction.

11. The nitride semiconductor light emitting device according to claim 1, wherein an angle between the c-axis of the hexagonal gallium nitride semiconductor and the normal axis to the support substrate is in a range of not less than 50 degrees and not more than 80 degrees and or in a range of not less than 100 degrees and not more than 130 degrees.

12. The nitride semiconductor light emitting device according to claim 1, wherein an angle between the c-axis of the hexagonal gallium nitride semiconductor and the normal axis to the support substrate is in a range of not less than 63 degrees and not more than 80 degrees or in a range of not less than 100 degrees and not more than 117 degrees.

13. The nitride semiconductor light emitting device according to claim 1, wherein a thickness of the p-type cladding layer is over a critical thickness in an Al composition of AlGaN of the p-type cladding layer.

14. The nitride semiconductor light emitting device according to claim 1, further comprising an n-type cladding layer provided between the support substrate and the semiconductor region,
    wherein the n-type cladding layer comprises an AlGaN layer, and wherein the n-type cladding layer is subject to tensile strain on the primary surface of the support substrate.

15. The nitride semiconductor light emitting device according to claim 1, further comprising an n-type cladding layer provided between the support substrate and the semiconductor region,
wherein the n-type cladding layer comprises an AlGaN layer, and
wherein a thickness of the n-type cladding layer is over a critical thickness in an Al composition of AlGaN of the n-type cladding layer.

16. The nitride semiconductor light emitting device according to claim 1, further comprising an n-type cladding layer provided between the support substrate and the semiconductor region,
wherein the n-type cladding layer comprises an InAlGaN layer, and
wherein the first gallium nitride-based semiconductor layer comprises InGaN.

17. An epitaxial substrate comprising:
a substrate comprising a hexagonal gallium nitride semiconductor;
a semiconductor region comprising an active layer, a first gallium nitride-based semiconductor layer, an electron block layer, and a second gallium nitride-based semiconductor layer, the semiconductor region being provided on a primary surface of the support substrate; and
a p-type cladding layer provided on a primary surface of the semiconductor region,
a c-axis of the hexagonal gallium nitride semiconductor being inclined to a predetermined direction with respect to a normal axis to the primary surface of the substrate,
the p-type cladding layer comprising AlGaN,
the electron block layer comprising AlGaN,
the first gallium nitride-based semiconductor layer being provided between the active layer and the electron block layer,
the second gallium nitride-based semiconductor layer being provided between the p-type cladding layer and the electron block layer,
the electron block layer being subject to tensile strain in the predetermined direction,
the first gallium nitride-based semiconductor layer being subject to compressive strain in the predetermined direction, and
a misfit dislocation density at an interface between the first gallium nitride-based semiconductor layer and the electron block layer being smaller than a misfit dislocation density at an interface between the second gallium nitride-based semiconductor layer and the p-type cladding layer.

18. The epitaxial substrate according to claim 17, wherein an angle between the c-axis of the hexagonal III-nitride semiconductor and the normal axis to the substrate is in the range of not less than 50 degrees and not more than 80 degrees or in the range of not less than 100 degrees and not more than 130 degrees.

19. The epitaxial substrate according to claim 17, further comprising an n-type cladding layer provided between the substrate and the semiconductor region,
wherein the n-type cladding layer comprises an AlGaN layer, and
wherein the n-type cladding layer is subject to tensile strain on the primary surface of the substrate.

20. The epitaxial substrate according to claim 17, further comprising an n-type cladding layer provided between the support substrate and the semiconductor region,
wherein the n-type cladding layer comprises an AlGaN layer, and
wherein a thickness of the n-type cladding layer is over a critical thickness in an Al composition of AlGaN of the n-type cladding layer.

* * * * *